(12) United States Patent
Elliot et al.

(10) Patent No.: US 9,624,137 B2
(45) Date of Patent: *Apr. 18, 2017

(54) LOW TEMPERATURE METHOD FOR HERMETICALLY JOINING NON-DIFFUSING CERAMIC MATERIALS

(71) Applicant: Component Re-Engineering Company, Inc., Santa Clara, CA (US)

(72) Inventors: Alfred Grant Elliot, Palo Alto, CA (US); Brent Donald Alfred Elliot, Cupertino, CA (US); Frank Balma, Los Gatos, CA (US); Richard Erich Schuster, Milpitas, CA (US); Dennis George Rex, Williams, OR (US); Alexander Veytser, Mountain View, CA (US)

(73) Assignee: Component Re-Engineering Company, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/292,804

(22) Filed: May 30, 2014

(65) Prior Publication Data

US 2015/0108203 A1 Apr. 23, 2015

Related U.S. Application Data

(63) Continuation-in-part of application No. 13/681,875, filed on Nov. 20, 2012, now Pat. No. 8,789,743, and
(Continued)

(51) Int. Cl.
*B23K 31/02* (2006.01)
*C04B 37/00* (2006.01)
(Continued)

(52) U.S. Cl.
CPC ............ *C04B 37/006* (2013.01); *B23K 1/008* (2013.01); *B23K 1/0016* (2013.01); *B23K 1/19* (2013.01);
(Continued)

(58) Field of Classification Search
None
See application file for complete search history.

(56) References Cited

U.S. PATENT DOCUMENTS 2,235,681 A * 3/1941 Haven ................. E06B 3/66342
156/109
2,801,375 A * 7/1957 Losco ........................... 257/763
(Continued)

FOREIGN PATENT DOCUMENTS

CN WO 2011063704 A1 * 6/2011
DE WO 2012055989 A1 * 5/2012 ......... B23K 35/0222
(Continued)

OTHER PUBLICATIONS

Machine translation of the specification of JP-10007480A (no date available).*
(Continued)

*Primary Examiner* — Kiley Stoner
(74) *Attorney, Agent, or Firm* — Michael A. Guth

(57) ABSTRACT

A method for the joining of ceramic pieces with a hermetically sealed joint comprising brazing a layer of joining material between the two pieces. The wetting and flow of the joining material is controlled by the selection of the joining material, the joining temperature, the joining atmosphere, and other factors. The ceramic pieces may be on a non-diffusable type, such as aluminum nitride, alumina, beryllium oxide, and zirconia, and the pieces may be brazed with an aluminum alloy under controlled atmosphere. The joint material is adapted to later withstand both the environments (Continued)

within a process chamber during substrate processing, and the oxygenated atmosphere which may be seen within the shaft of a heater or electrostatic chuck.

26 Claims, 42 Drawing Sheets

Related U.S. Application Data a continuation-in-part of application No. 13/543,727, filed on Jul. 6, 2012, now Pat. No. 8,932,690.

(51) Int. Cl.

| | |
|---|---|
| B23K 35/28 | (2006.01) |
| B23K 1/00 | (2006.01) |
| B23K 1/19 | (2006.01) |
| B23K 1/20 | (2006.01) |
| B23K 35/00 | (2006.01) |
| B32B 9/00 | (2006.01) |
| B32B 9/04 | (2006.01) |
| B32B 15/20 | (2006.01) |
| C04B 35/645 | (2006.01) |
| H01L 21/687 | (2006.01) |
| B23K 35/38 | (2006.01) |
| B23K 1/008 | (2006.01) |
| B23K 3/08 | (2006.01) |
| F16B 9/00 | (2006.01) |
| F16B 11/00 | (2006.01) |

(52) U.S. Cl.
CPC .............. *B23K 1/20* (2013.01); *B23K 3/087* (2013.01); *B23K 35/005* (2013.01); *B23K 35/286* (2013.01); *B23K 35/38* (2013.01); *B32B 9/005* (2013.01); *B32B 9/04* (2013.01); *B32B 9/041* (2013.01); *B32B 15/20* (2013.01); *C04B 35/645* (2013.01); *C04B 37/001* (2013.01); *H01L 21/68785* (2013.01); *H01L 21/68792* (2013.01); *C04B 2235/6562* (2013.01); *C04B 2235/6565* (2013.01); *C04B 2235/6567* (2013.01); *C04B 2235/6581* (2013.01); *C04B 2235/6582* (2013.01); *C04B 2235/945* (2013.01); *C04B 2237/121* (2013.01); *C04B 2237/122* (2013.01); *C04B 2237/126* (2013.01); *C04B 2237/127* (2013.01); *C04B 2237/34* (2013.01); *C04B 2237/343* (2013.01); *C04B 2237/348* (2013.01); *C04B 2237/36* (2013.01); *C04B 2237/365* (2013.01); *C04B 2237/366* (2013.01); *C04B 2237/368* (2013.01); *C04B 2237/592* (2013.01); *C04B 2237/61* (2013.01); *C04B 2237/64* (2013.01); *C04B 2237/66* (2013.01); *C04B 2237/68* (2013.01); *C04B 2237/704* (2013.01); *C04B 2237/708* (2013.01); *C04B 2237/72* (2013.01); *C04B 2237/76* (2013.01); *C04B 2237/765* (2013.01); *C04B 2237/80* (2013.01); *C04B 2237/84* (2013.01); *F16B 9/00* (2013.01); *F16B 11/006* (2013.01); *Y10T 403/46* (2015.01); *Y10T 428/31504* (2015.04); *Y10T 428/31678* (2015.04)

(56) References Cited

U.S. PATENT DOCUMENTS

| | | | | |
|---|---|---|---|---|
| 3,010,057 | A * | 11/1961 | Albert | 257/747 |
| 3,656,225 | A * | 4/1972 | Bereza | 228/121 |
| 3,777,281 | A * | 12/1973 | Hochuli | C03C 27/06 228/121 |
| 3,787,958 | A * | 1/1974 | Freedman et al. | 228/175 |
| 3,857,161 | A * | 12/1974 | Hutchins, IV | B23K 28/003 228/121 |
| 4,196,837 | A * | 4/1980 | Burkart | B23K 20/24 228/116 |
| 4,247,034 | A * | 1/1981 | Burkart | B23K 20/24 228/116 |
| 4,471,026 | A * | 9/1984 | Nicholas et al. | 428/450 |
| 4,508,256 | A * | 4/1985 | Radel | A61F 13/15577 216/33 |
| 4,580,716 | A * | 4/1986 | Barresi et al. | 228/219 |
| 4,602,731 | A * | 7/1986 | Dockus | 228/121 |
| 4,838,474 | A * | 6/1989 | Ohashi | B23K 35/002 228/121 |
| 4,854,495 | A * | 8/1989 | Yamamoto et al. | 228/124.1 |
| 4,872,606 | A * | 10/1989 | Satoh et al. | 228/121 |
| 5,096,749 | A * | 3/1992 | Harada et al. | 427/404 |
| 5,104,835 | A * | 4/1992 | Luszcz | C04B 35/652 156/89.27 |
| 5,188,280 | A * | 2/1993 | Nakao | H01L 21/4853 228/123.1 |
| 5,372,298 | A * | 12/1994 | Glaeser | 228/195 |
| 5,392,981 | A * | 2/1995 | Makowiecki et al. | 228/122.1 |
| 5,451,279 | A * | 9/1995 | Kohinata | C04B 37/005 156/89.27 |
| 5,664,723 | A * | 9/1997 | Sastri | 228/124.1 |
| 5,794,838 | A * | 8/1998 | Ushikoshi et al. | 228/121 |
| 5,904,993 | A * | 5/1999 | Takeuchi et al. | 428/627 |
| 5,998,041 | A * | 12/1999 | Makino et al. | 428/621 |
| 6,020,076 | A * | 2/2000 | Fujii et al. | 428/621 |
| 6,033,787 | A * | 3/2000 | Nagase et al. | 428/545 |
| 6,076,727 | A * | 6/2000 | Evans et al. | 228/183 |
| 6,261,703 | B1 * | 7/2001 | Sasaki et al. | 428/627 |
| 6,267,289 | B1 * | 7/2001 | Miola | B01J 3/048 228/119 |
| 6,268,069 | B1 * | 7/2001 | Ohashi et al. | 428/621 |
| 6,328,198 | B1 * | 12/2001 | Ohashi et al. | 228/194 |
| 6,367,683 | B1 * | 4/2002 | Rass et al. | 228/121 |
| 6,440,578 | B1 * | 8/2002 | Shinkai et al. | 428/548 |
| 6,447,626 | B1 * | 9/2002 | Ohashi | 156/89.27 |
| 6,756,132 | B2 * | 6/2004 | Fujii et al. | 428/642 |
| 6,921,881 | B2 * | 7/2005 | Ito et al. | 219/145.22 |
| 7,073,703 | B2 * | 7/2006 | Takahashi et al. | 228/262.5 |
| 7,098,428 | B1 * | 8/2006 | Elliot et al. | 219/444.1 |
| 7,128,979 | B2 * | 10/2006 | Nagase et al. | 428/545 |
| 7,735,718 | B2 * | 6/2010 | Graham et al. | 228/262.51 |
| 8,186,565 | B1 * | 5/2012 | Pyzik et al. | 228/110.1 |
| 2002/0050510 | A1 * | 5/2002 | Osanai et al. | 228/245 |
| 2002/0075624 | A1 * | 6/2002 | Wang et al. | 361/234 |
| 2002/0121541 | A1 * | 9/2002 | Lugscheider et al. | 228/248.1 |
| 2002/0125300 | A1 * | 9/2002 | Ishikawa et al. | 228/122.1 |
| 2003/0141345 | A1 * | 7/2003 | Shinkai et al. | 228/122.1 |
| 2003/0218058 | A1 * | 11/2003 | Shaw | B23K 1/012 228/230 |
| 2004/0074951 | A1 * | 4/2004 | Takahashi | B32B 15/04 228/219 |
| 2005/0118450 | A1 * | 6/2005 | Fujii et al. | 428/621 |
| 2006/0006212 | A1 * | 1/2006 | Thebault | B23K 1/08 228/121 |
| 2006/0115323 | A1 * | 6/2006 | Coppeta et al. | 403/270 |
| 2007/0023489 | A1 * | 2/2007 | Swiston et al. | 228/262.9 |
| 2007/0034305 | A1 * | 2/2007 | Suh | 148/561 |
| 2007/0144667 | A1 * | 6/2007 | Hattori | 156/293 |
| 2007/0228109 | A1 * | 10/2007 | Smith et al. | 228/176 |
| 2008/0087710 | A1 * | 4/2008 | Glaeser | 228/121 |
| 2008/0305356 | A1 * | 12/2008 | Weil | C04B 37/006 428/640 |
| 2010/0242844 | A1 * | 9/2010 | Kuibira et al. | 118/725 |
| 2010/0276473 | A1 * | 11/2010 | Hagen | B23K 1/19 228/121 |
| 2010/0285331 | A1 * | 11/2010 | Kitahara et al. | 428/650 |
| 2011/0288648 | A1 * | 11/2011 | Joseph et al. | 623/18.11 |
| 2012/0038038 | A1 * | 2/2012 | Yamaguchi et al. | 257/734 |
| 2012/0121896 | A1 * | 5/2012 | Ning et al. | 428/336 |
| 2012/0321822 | A1 * | 12/2012 | Li | B23K 1/0008 428/34 |

(56) References Cited

U.S. PATENT DOCUMENTS

| | | | | |
|---|---|---|---|---|
| 2013/0004235 A1* | 1/2013 | Chaumat | ............... | C04B 37/005 403/272 |
| 2013/0136878 A1* | 5/2013 | Elliot et al. | ................... | 428/34.6 |
| 2013/0213138 A1* | 8/2013 | Rossberg | ........... | B23K 35/0222 73/700 |
| 2014/0030634 A1* | 1/2014 | Nanbu | ................. | B23K 35/002 429/516 |

FOREIGN PATENT DOCUMENTS

| | | | |
|---|---|---|---|
| FR | WO 2011113758 A1 * | 9/2011 | ........... B23K 1/0008 |
| JP | 06-115009 A * | 4/1994 | |
| JP | 09-249465 A * | 9/1997 | |
| JP | 10007480 A * | 1/1998 | |
| WO | WO 2009066692 A1 * | 5/2009 | |

OTHER PUBLICATIONS

Machine translation of the claims of JP-10007480A (no date available).*

Nicholas et al., Some observations on the wetting and bonding of nitride ceramics, Journal of Materials Science 25 (1990), Chapman and Hall Ltd.

Rhee, Wetting of Ceramics by Liquid Aluminum, Fall Meeting of the Ceramic-Metal Systems Division of the American Ceramic Society, Fort Worth, Texas, Sep. 10, 1968.

* cited by examiner

LOW TEMPERATURE METHOD FOR HERMETICALLY JOINING NON-DIFFUSING CERAMIC MATERIALS

CROSS-REFERENCE TO RELATED APPLICATIONS

This application is a continuation in part of U.S. patent application Ser. No. 13/681,875 to Elliot et al., filed Nov. 20, 2012, which claims priority to U.S. Provisional Application No. 61/565,396 filed Nov. 30, 2011 to Elliot et al., which is hereby incorporated by reference in its entirety. This application claims priority to U.S. Provisional Application No. 61/592,587 to Elliot et al., filed Jan. 30, 2012, which is hereby incorporated by reference in its entirety. This application claims priority to U.S. Provisional Application No. 61/605,707 to Elliot et al., filed Mar. 1, 2012, which is hereby incorporated by reference in its entirety. This application claims priority to U.S. Provisional Application No. 61/658,896 to Elliot et al., filed Jun. 12, 2012, which is hereby incorporated by reference in its entirety. This application claims priority to U.S. Provisional Application No. 61/707,865 to Elliot et al., filed Sep. 28, 2012, which is hereby incorporated by reference in its entirety. This application is also a continuation in part of U.S. patent application Ser. No. 13/543,727 to Elliot et al., filed Jul. 6, 2012, which is hereby incorporated by reference in its entirety.

BACKGROUND

Field of the Invention

The present invention relates to methods for joining together objects, and more particularly to brazing methods for joining non-diffusing ceramic objects.

Description of Related Art

The joining of ceramic materials may involve processes which require very high temperatures and very high contact pressures. For example, liquid phase sintering may be used to join ceramic materials together. In this type of manufacture, at least two drawbacks are seen. First, the hot pressing/sintering of a large, complex ceramic piece requires a large physical space within a very specialized process oven. Second, should a portion of the finished piece become damaged, or fail due to wear, there is no repair method available to disassemble the large piece. The specialized fixturing, high temperatures, and inability to disassemble these assemblies invariably leads to very high manufacturing costs.

Other processes may be geared towards strength, and may yield strong bonds between the pieces that, although structurally sufficient, do not hermetically seal the pieces. In some processes, diffusion bonding is used, which may take significant amounts of time, and may also alter the individual pieces such that they form new compounds near the joint. This may render them unfit for certain applications, and unable to be reworked or repaired and rejoined.

Certain ceramics may allow for the joining of the ceramic pieces with hermetic joints at low temperatures. Ceramic materials may be categorized by their diffusability. The diffusability of the ceramic may play a part in whether low temperature brazing will result in hermetic joining.

What is called for is a joining method for joining ceramic pieces at a low temperature and which provides a hermetic seal, and which allows for repairs.

SUMMARY OF THE INVENTION

A method for the joining of ceramic pieces with a hermetically sealed joint comprising brazing a layer of joining material between the two pieces. The wetting and flow of the joining material is controlled by the selection of the joining material, the joining temperature, the joining atmosphere, and other factors. The ceramic pieces may be of a non-diffusable type, such aluminum nitride, alumina, beryllium oxide, and zirconia, and the pieces may be brazed with an aluminum alloy under controlled atmosphere. The joint material is adapted to later withstand both the environments within a process chamber during substrate processing, and the oxygenated atmosphere which may be seen within the shaft of a heater or electrostatic chuck.

DETAILED DESCRIPTION

Figure 1:
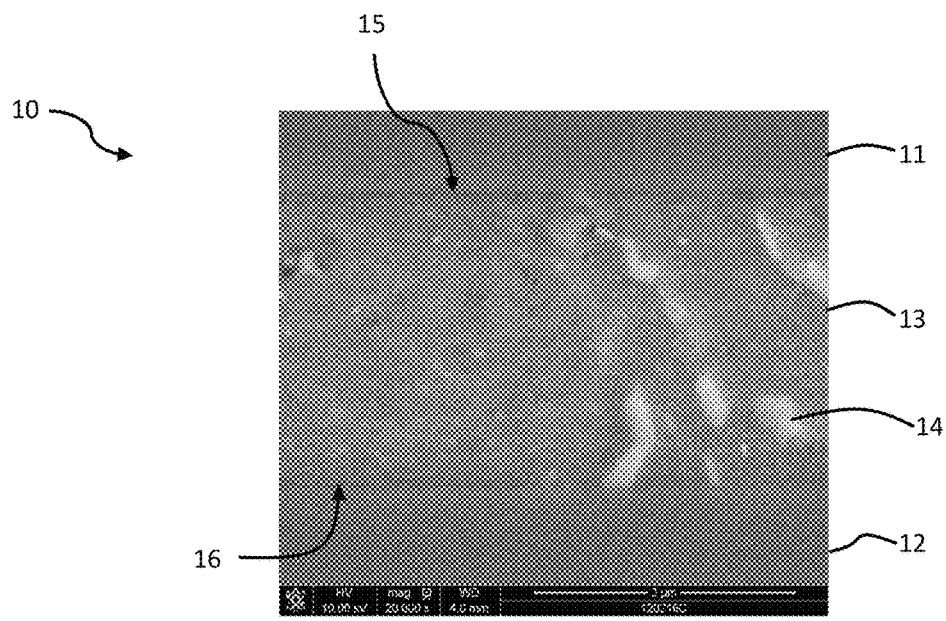
FIG. 1 is a SEM cross-sectional view of a joint according to some embodiments of the present invention.

Some prior processes for the joining of ceramic materials required specialized ovens, and compression presses within the ovens, in order to join the materials. For example, with liquid phase sintering, two pieces may be joined together under very high temperatures and contact pressures. The high temperature liquid-phase sintering process may see temperatures in the range of 1700 C and contact pressures in the range of 2500 psi.

Other prior processes may utilize diffusion of a joining layer into the ceramic, and/or of the ceramic into the joining layer. In such processes, a reaction at the joint area may cause changes to the material composition of the ceramic in the area near the joint. This reaction may depend upon oxygen in the atmosphere to promote the diffusion reaction.

In contrast to the aforementioned diffusion processes, joining methods according to some embodiments of the present invention rely on control of wetting and flow of the joining material relative to the ceramic pieces to be joined. In some embodiments, the absence of oxygen during the joining process allows for proper wetting without reactions which change the materials in the joint area. With proper wetting and flow of the joining material, a hermetically sealed joint can be attained at relatively low temperature. In some embodiments of the present invention, a pre-metallization of the ceramic in the area of the joint is done prior to the joining process.

In some applications where end products of joined ceramics are used, strength of the joint may not be the key design factor. In some applications, hermeticity of the joint may be required to allow for separation of atmospheres on either side of the joint. Also, the composition of the joining material may be important such that it is resistant to chemicals which the ceramic assembly end product may be exposed to. The joining material may need to be resistant to the chemicals, which otherwise might cause degeneration of the joint, and loss of the hermetic seal. The joining material may also need to be of a type of material which does not negatively interfere with the processes later supported by the finished ceramic device.

Ceramic end products manufactured according to embodiments of the present invention may be manufactured with considerable energy savings relative to past processes. For example, the lower temperatures used for joining pieces with methods according the present invention, compared to the high temperatures of prior liquid phase sintering processes used for joining pieces, require less energy. In addition, there may be considerable savings in that the joining processes of the present invention do not require the specialized high temperature ovens, and the specialized fixturing and presses required to generate the high physical contact stresses, required for prior liquid phase sintering processes.

An example of a joined ceramic end product which may be manufactured according to embodiments of the present invention is the manufacture of a heater assembly used in semiconductor processing.

FIG. 1 is a view of a cross-section of a joint 10 according to some embodiments of the present invention. The image is a as seen through a Scanning Electron Microscope (SEM), and is taken at 20,000× magnification. A first ceramic piece 11 has been joined to a second ceramic piece 12 with a joining layer 13. In this exemplary embodiment, the first ceramic piece and second ceramic piece are made of monocrystalline aluminum nitride (AlN). The joining layer began as aluminum foil with 0.4 Wt. % Fe. The joining temperature was 1200 C and was held for 120 minutes. The joining was done under a vacuum of 7.3×10E-5 Torr, with a physical contact pressure across the joint of approx. 290 psi during joining.

FIG. 1 illustrates the joint with an upper boundary 15 between the first ceramic piece 11 and the joining layer 13, and a lower boundary 16 between the joining layer 13 and the second ceramic piece 12. As seen at the boundary regions at 20,000× magnification, no diffusion is seen of the joining layer into the ceramic pieces. No evidence of reaction within the ceramics is seen. The boundaries do not show any evidence of voids and do indicate that there was complete wetting of the boundaries by the aluminum during the joining process. The bright spots 14 seen in the joining layer are an aluminum-iron compound, the iron being a residue from the foil used for the joining layer.

Figure 2:
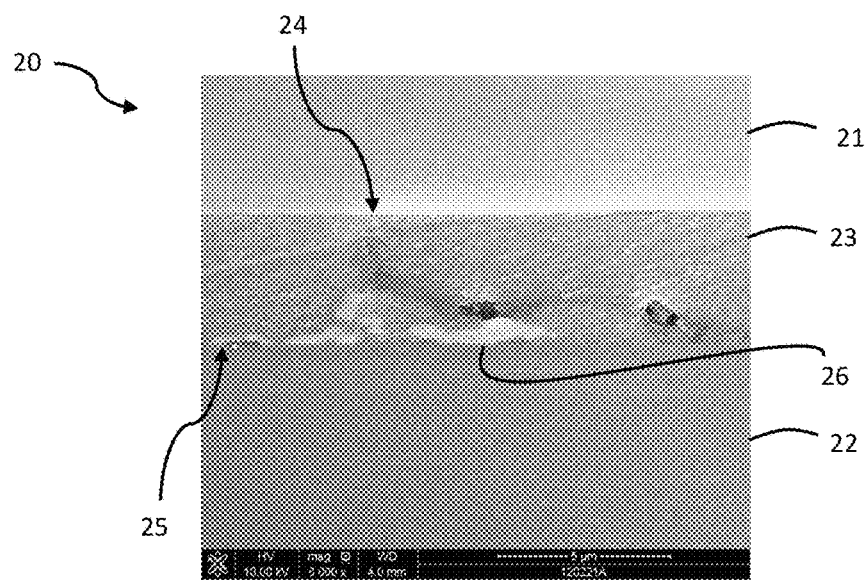
FIG. 2 is a SEM cross-sectional view of a joint according to some embodiments of the present invention.

FIG. 2 is a view of a cross-section of a joint 20 according to some embodiments of the present invention. The view is as seen through a Scanning Electron Microscope (SEM), and is at 8,000× magnification. A first ceramic piece 21 has been joined to a second ceramic piece 22 with a joining layer 23. In this exemplary embodiment, the first ceramic piece and second ceramic piece are made of mono-crystalline aluminum nitride (AlN). The joining layer began as aluminum foil with 0.4 Wt. % Fe. The joining temperature was 900 C and was held for 15 minutes. The joining was done under a vacuum of 1.9×10E-5 Torr, with a minimal physical contact pressure across the joint during joining. The joining layer 23 illustrates that after the joining of the first ceramic piece 21 and the second piece 22 a residual layer of aluminum remains between the joined pieces.

FIG. 2 illustrates the joint with an upper boundary 24 between the first ceramic piece 21 and the joining layer 23, and a lower boundary 25 between the joining layer 23 and the second ceramic piece 22. As seen at the boundary regions at 8,000× magnification, no diffusion is seen of the joining layer into the ceramic pieces. No evidence of reaction within the ceramics is seen. The boundaries do not show any evidence of voids and do indicate that there was complete wetting of the boundaries by the aluminum during the joining process. The bright spots 26 seen in the joining layer contain Fe residue from the foil used for the joining layer.

FIGS. 1 and 2 illustrate joints according to embodiments of the present invention in which ceramics, such as mono-crystalline aluminum nitride, are joined with a joining layer of aluminum that achieved full wetting during the joining process. The joints show no evidence of diffusion of the joining layer into the ceramic, and no evidence of reaction areas within the joining layer or in the ceramic pieces. There is no evidence of a chemical transformation within the ceramic pieces or the joining layer. There is a residual layer of aluminum present after the joining process.

Figure 3:
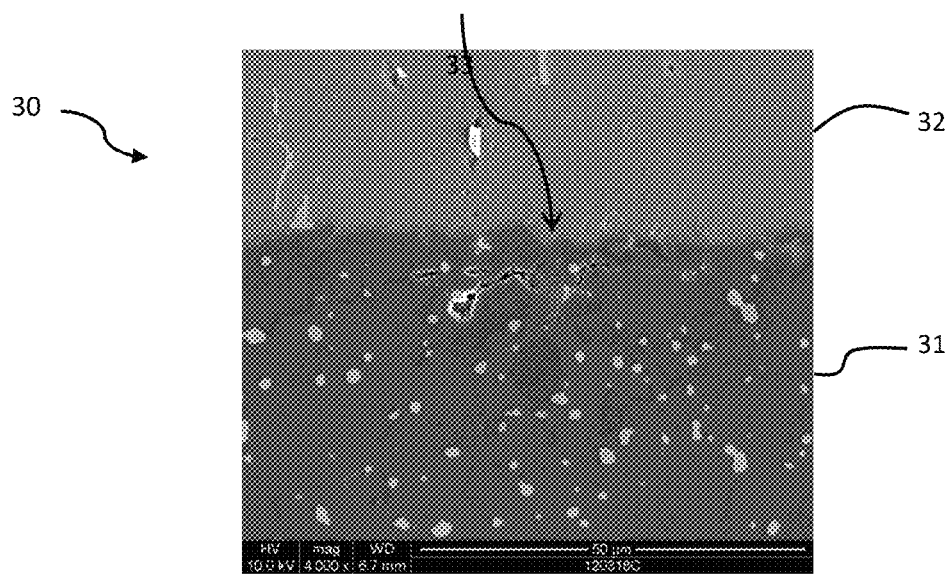
FIG. 3 is a SEM cross-sectional view of a joint according to some embodiments of the present invention.

FIG. 3 illustrates a joint 30 according to embodiments of the present invention using a polycrystalline aluminum nitride ceramic. In FIG. 3, the joining layer 32 is seen joined to the lower ceramic piece 31. The view is as seen through a Scanning Electron Microscope (SEM), and is at 4,000× magnification. In this exemplary embodiment, the first ceramic piece is made of poly-crystalline aluminum nitride (AlN). The joining layer began as aluminum foil with 0.4 Wt. % Fe. The joining temperature was 1200 C and was held for 60 minutes. The joining was done under a vacuum of 2.4×10E-5 Torr, with a physical contact pressure across the joint during joining of approximately 470 psi.

Figure 4:
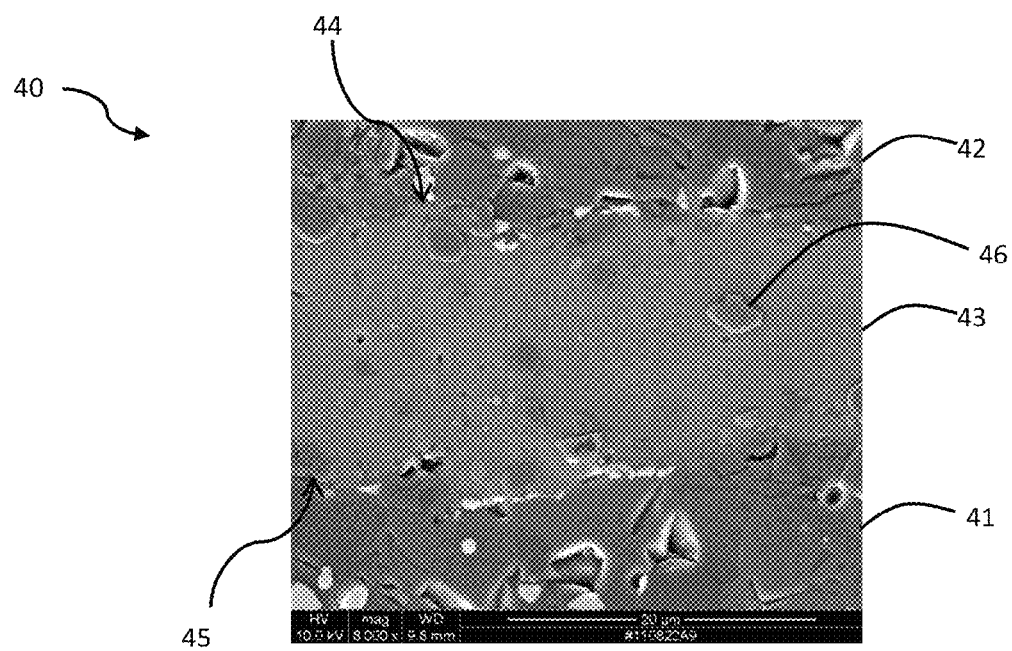
FIG. 4 is a SEM cross-sectional view of a joint according to some embodiments of the present invention.
Figure 5:
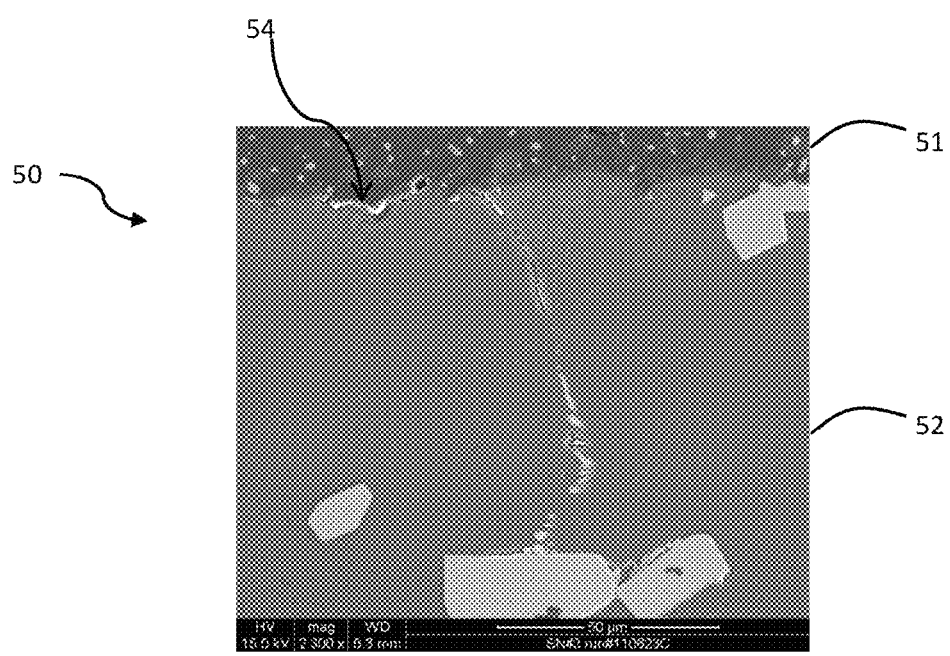
FIG. 5 is a SEM cross-sectional view of a joint according to some embodiments of the present invention.

In some embodiments, the poly-crystalline AlN, such as the ceramic seen in FIGS. 3-5, is comprised of 96% AlN and 4% Yttria. Such a ceramic may be used in industrial applications because during the liquid phase sintering used to manufacture the ceramic, a lower temperature may be used. The lower temperature process, in contrast to mono-crystalline AlN, reduces manufacturing energy consumption and costs of the ceramic. The poly-crystalline material may also have preferred properties, such as being less brittle. Yttria and other dopants, such as $Sm_2O_3$, are often used for manufacturability and tuning of material properties.

FIG. 3 illustrates the same lack of diffusion at the boundary 33 between the joining layer 32 and the first ceramic piece 31, which is a poly-crystalline AlN ceramic, as was seen with the mono-crystalline examples seen in FIGS. 1 and 2. Although the boundary 33 may appear to be somewhat rougher than seen in FIGS. 1 and 2, this is a result of a rougher original surface. No diffusion is seen along the boundary.

With a poly-crystalline AlN such as the 96% AlN-4% Yttria ceramic as seen in FIGS. 3-5, the ceramic presents grains of AlN which are interspersed with yttrium aluminate. When this ceramic is presented with aluminum, such as joining layers according to some embodiments of the present invention, at higher temperature such as above the liquidus temperature of Al, the Al brazing material may react with the yttrium aluminate resulting in the dislodging and release of some of the AlN grains at the surface of the ceramic.

FIG. 4 illustrates a joint 40 according to embodiments of the present invention using a polycrystalline aluminum nitride ceramic. In FIG. 4, the joining layer 43 is seen joining the upper ceramic piece 42 to the lower ceramic piece 41. The view is as seen through a Scanning Electron Microscope (SEM), and is at 8,000× magnification. In this exemplary embodiment, the first ceramic piece is made of poly-crystalline aluminum nitride (AlN). The joining layer began as aluminum foil with 99.8% Al. The joining temperature was 1120 C and was held for 60 minutes. The joining was done under a vacuum of 2.0×10E-5 Torr, with a minimal physical contact pressure across the joint during joining.

FIG. 4 illustrates some grains 46 of AlN within the joining layer 43. The grains 46 have migrated from the surface 44 of the upper ceramic piece 42 and/or the surface 45 of the lower ceramic piece 41. The AlN grains have been dislodged from the surface due to the aluminum of the joining layer having attacked the yttrium aluminate between the grains of the poly-crystalline AlN. The AlN grains themselves have not reacted with the aluminum joining layer, nor is any sign of diffusion of the aluminum into the AlN grains seen. The non-susceptibility of AlN to diffusion with aluminum under the conditions of processes according to embodiments of the present invention had been previously seen in the examples of mono-crystalline AlN of FIGS. 1 and 2, and is maintained in the poly-crystalline example of FIG. 4.

FIG. 5 illustrates a joint 50 according to embodiments of the present invention using a poly-crystalline aluminum nitride ceramic. In FIG. 5, the joining layer 52 is seen joined to the upper ceramic piece 51. The view is as seen through a Scanning Electron Microscope (SEM), and is at 2,300× magnification. In this exemplary embodiment, the first ceramic piece 51 is made of poly-crystalline aluminum nitride (AlN). The joining layer began as aluminum powder with 5 Wt. % Zr. The joining temperature was 1060 C and was held for 15 minutes. The joining was done under a vacuum of 4.0×10E-5 Torr, with a physical contact pressure across the joint during joining of approximately 8 psi.

The joints as seen in the examples of FIGS. 1-5 may be used in applications where a hermetically sealed joint between ceramic pieces is required. The prior process of hermetically joining ceramic pieces using liquid phase sintering required very high temperatures, very specialized ovens and presses, significant amounts of time, and were quite costly. The joining of ceramics with hermetically sealed joints using processes according to embodiments of the present invention require lower temperatures, less extensive and less costly process ovens, less time, and result in significant cost savings. In addition, the joined pieces may later be separated and reworked if desired. The joined pieces are seen with residual aluminum in the joint area between the joined ceramic pieces.

The joints seen in FIGS. 1-5 are aluminum nitride, and, as discussed above, this ceramic is non-susceptible to diffusion during the joining process. New research has shown that ceramics other than aluminum nitride also are able to be joined in this fashion with no measurable diffusion of aluminum into the ceramic. This category of ceramics has been shown to be able to be joined to itself, or to other ceramics within the category, with hermetic joints using the methods described herein. Among the non-diffusing ceramics in this category are aluminum nitride, alumina, zirconia, and beryllium oxide.

In contrast, other ceramics have been found to have significant diffusion of aluminum into the ceramic. These ceramics have been found to be joined with joints that are not hermetic joints using the methods described herein. Among the ceramics in this category are silicon carbide and silicon nitride.

A new way of classifying ceramics has thus emerged in which a group of ceramics has been identified by its diffusability, and links that diffusability to the group's non-susceptability to diffusion by aluminum in the temperature ranges discussed herein. Together with the use of temperatures in a range not typical of standard brazing temperatures, and using brazing materials as described herein, and with the atmospheres discussed herein, this group of ceramics may be joined with hermetic joints not formerly attainable. This group of ceramics comprises aluminum nitride, alumina, zirconia, and beryllia. Other ceramics which are not susceptible to diffusion by aluminum would also be in this group.

FIGS. 42-45 are cross-sections of joints using ceramics which are not susceptible to diffusion with aluminum, according to some embodiments of the present invention. The images are as seen through a Scanning Electron Microscope (SEM), and the scale is as shown in the lower right of the images.

Figure 42:
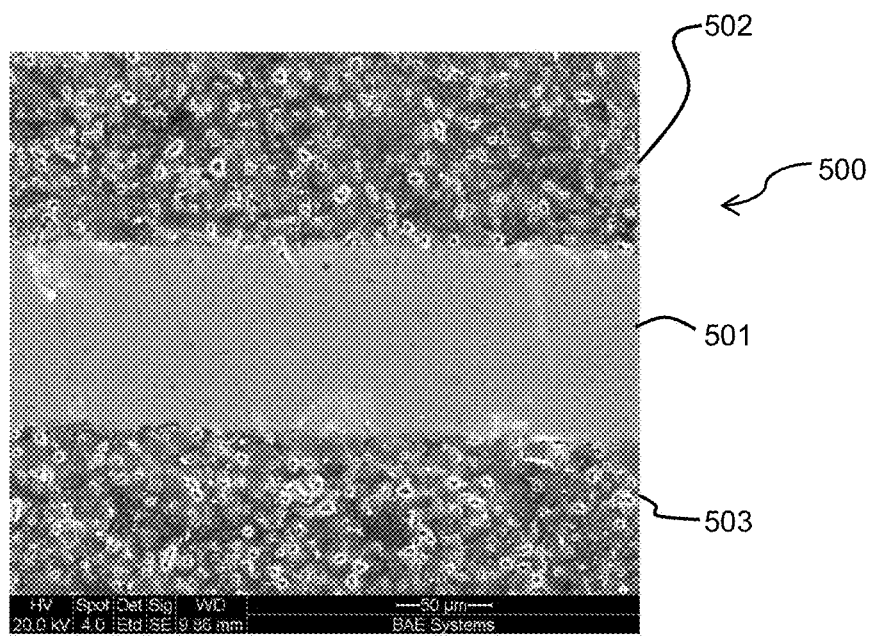
FIG. 42 is a SEM cross-sectional view of a joint according to some embodiments of the present invention.

FIG. 42 illustrates a joint 500 according to embodiments of the present invention. In FIG. 42, the joining layer 501 is seen joining the upper ceramic piece 502 to the lower ceramic piece 503. The view is as seen through a Scanning Electron Microscope (SEM), and is scaled as seen in the display bar in the image. In this exemplary embodiment, the first ceramic piece and the second ceramic piece are made of beryllium oxide (BeO). The joining layer began as aluminum foil with 99.99% Al. The joining temperature was 800 C and was held for 10 minutes. The joining was done under a vacuum of 10E-6 Torr, with a minimal physical contact pressure across the joint during joining. The joining layer began as 0.004 inch foil and the resulting joint was maintained at 0.0035 inches thick using standoffs, as described below herein.

FIG. 42 illustrates that the BeO pieces have not reacted with the aluminum joining layer, nor is any sign of diffusion of the aluminum into the BeO seen. The joint is seen with good and complete wetting of the aluminum to the BeO ceramic, and without voids. This joint was hermetic. The non-susceptibility of BeO to diffusion with aluminum under the conditions of processes according to embodiments of the present invention had been previously seen in the examples of AlN, and is maintained with the use of BeO.

Figure 43:
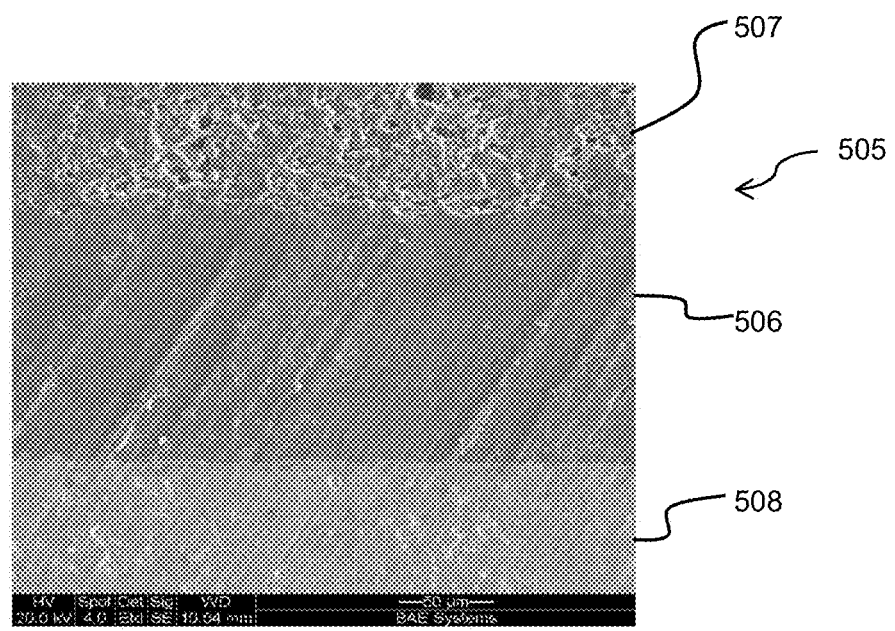
FIG. 43 is a SEM cross-sectional view of a joint according to some embodiments of the present invention.

FIG. 43 illustrates a joint 505 according to embodiments of the present invention. In FIG. 43, the joining layer 506 is seen joining the upper ceramic piece 507 to the lower ceramic piece 508. The view is as seen through a Scanning Electron Microscope (SEM), and is scaled as seen in the display bar in the image. In this exemplary embodiment, the first ceramic piece is of alumina (Al2O3)) and the second ceramic piece are made of yttria stabilized zirconia (YSZ). The joining layer began as aluminum foil with 99.99% Al. The joining temperature was 800 C and was held for 10 minutes. The joining was done under a vacuum of 10E-6 Torr, with a minimal physical contact pressure across the joint during joining. The joining layer began as 0.004 inch foil and the resulting joint was maintained at 0.0035 inches thick using standoffs, as described below herein.

FIG. 43 illustrates that the alumina, and the zirconia pieces have not reacted with the aluminum joining layer, nor is any sign of diffusion of the aluminum into the Al2O3 or the YSZ seen. The joint is seen with good and complete wetting of the aluminum to the ceramics, and without voids. This joint was hermetic. The non-susceptibility of Al2O3 or the YSZ to diffusion with aluminum under the conditions of processes according to embodiments of the present invention had been previously seen in the examples of AlN and BeO, and is maintained with the use of Al2O3 and the YSZ. Energy dispersive x-ray analysis has verified that the aluminum joint material has not diffused into the zirconia or the beryllium oxide, for example. In discussions herein the YSZ may be referred to simply as zirconia.

Figure 44:
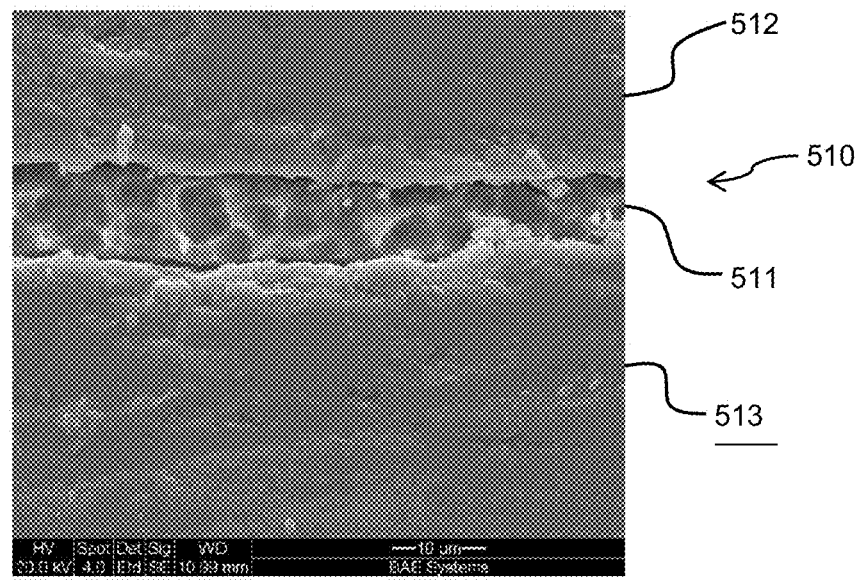
FIG. 44 is a SEM cross-sectional view of a joint with a diffusing ceramic.
Figure 45:
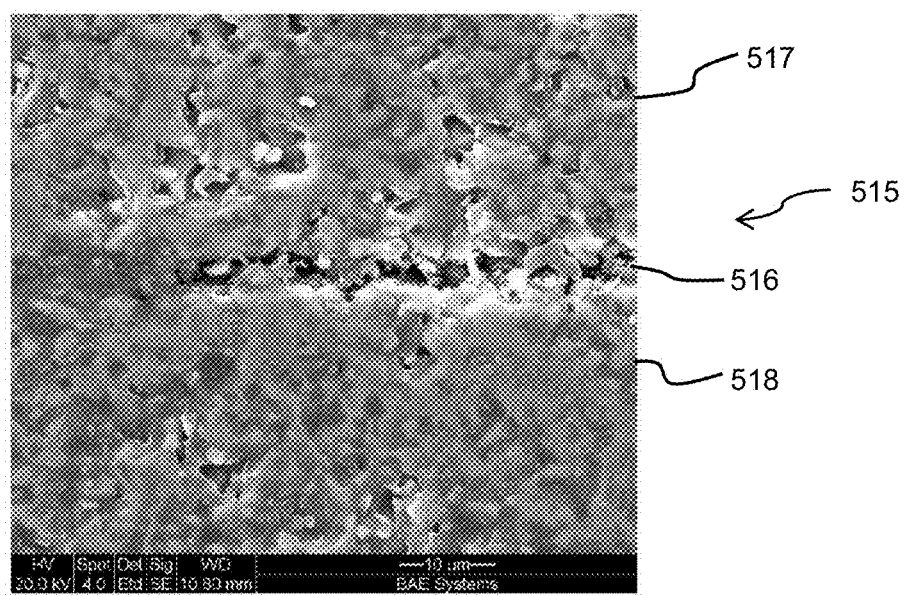
FIG. 45 is a SEM cross-sectional view of a joint with a diffusing ceramic.
Figure 46:
FIG. 46 is a view representing the joint integrity of a joint.
Figure 47:
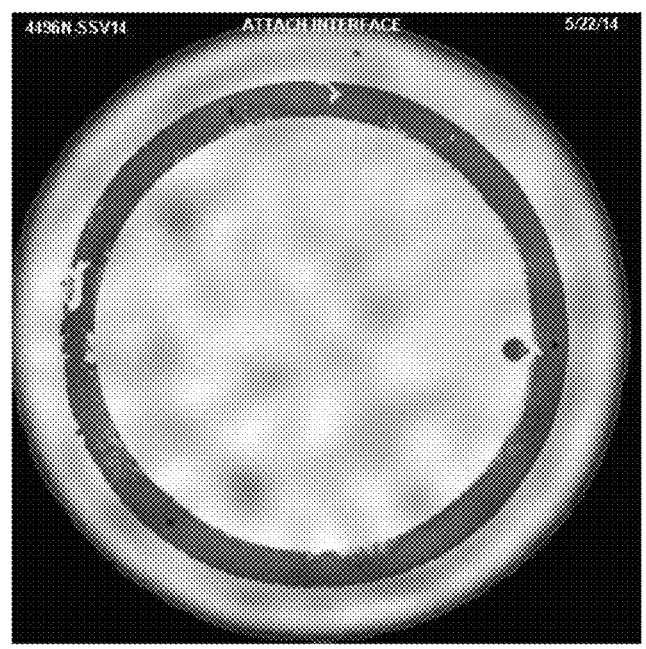
FIG. 47 is a view representing the joint integrity of a joint.
Figure 48:
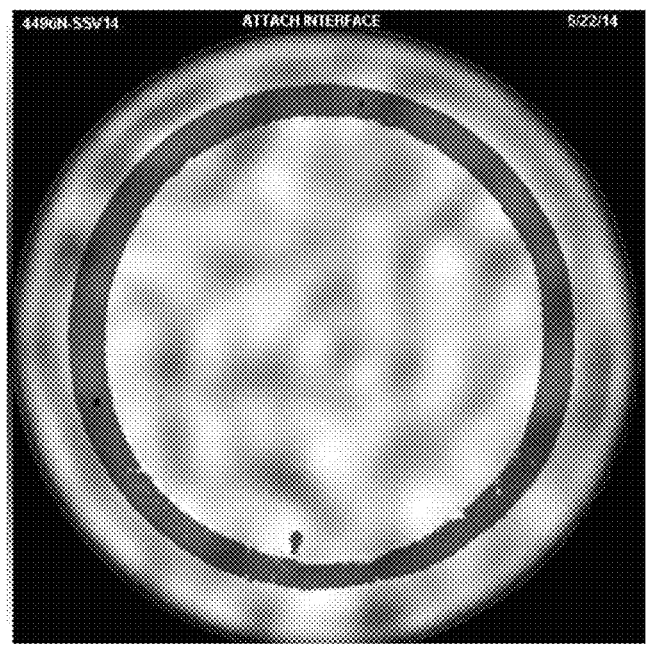
FIG. 48 is a view representing the joint integrity of a joint.
Figure 49:
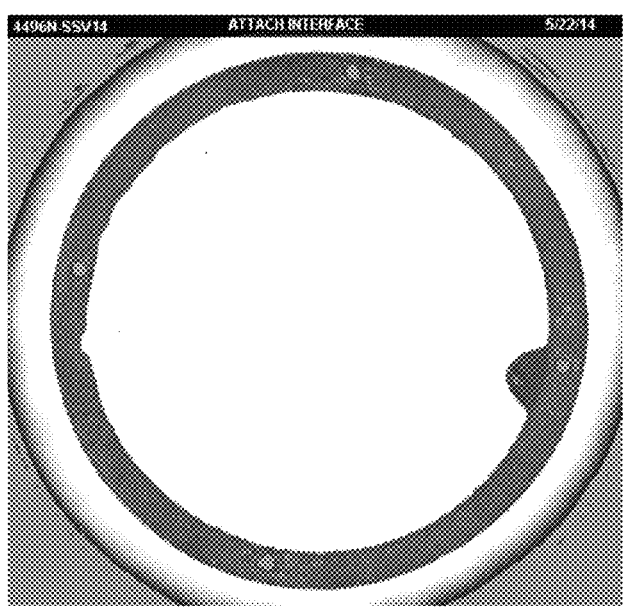
FIG. 49 is a view representing the joint integrity of a joint.
Figure 50:
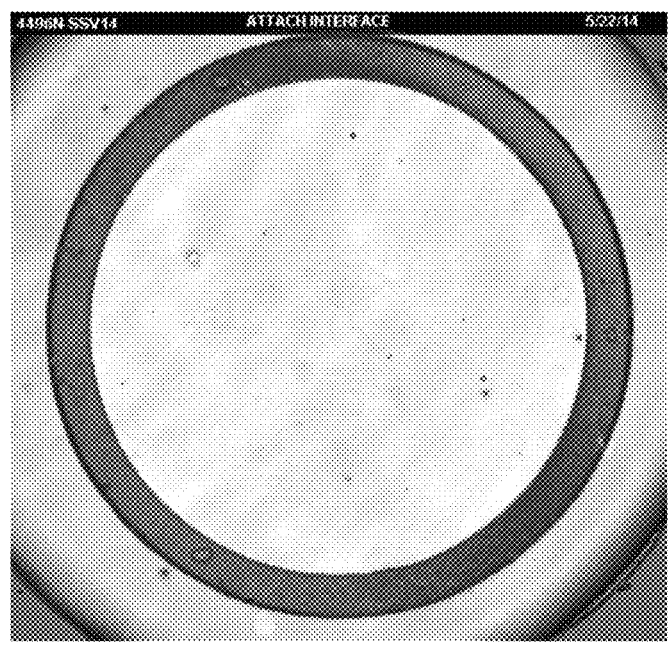
FIG. 50 is a view representing the joint integrity of a joint.

In contrast, FIGS. 44 and 45 illustrate joints where the aluminum joining layer has diffused into the ceramic. Also, the ceramic has diffused into the aluminum joining layer. Significantly, the joints were not hermetic. FIG. 44 illustrates a joint 510 where the joining layer 511 is seen joining the upper ceramic piece 512 to the lower ceramic piece 513. The view is as seen through a Scanning Electron Microscope (SEM), and is scaled as seen in the display bar in the image. In this example, the first ceramic piece is of silicon nitride (SiN) and the second ceramic piece is also SiN. The joining layer began as aluminum foil with 99.99% Al. The joining temperature was 800 C and was held for 10 minutes. The joining was done under a vacuum of 10E-6 Torr, with a minimal physical contact pressure across the joint during joining. The joining layer began as 0.004 inch foil. The joint was not hermetic.

EDX analysis demonstrated that aluminum from the joint of FIG. 44 diffused into SiN ceramic. Also, EDX analysis demonstrated that Si had diffused into the aluminum brazing layer. The SiN was therefore not in the group of non-diffusing ceramics which included the other ceramics mentioned above.

FIG. 45 illustrates a joint 515 where the joining layer 516 is seen joining the upper ceramic piece 517 to the lower ceramic piece 518. The view is as seen through a Scanning Electron Microscope (SEM), and is scaled as seen in the display bar in the image. In this example, the first ceramic piece is of silicon carbide (SiC) and the second ceramic piece is also SiC. The joining layer began as aluminum foil with 99.99% Al. The joining temperature was 800 C and was held for 10 minutes. The joining was done under a vacuum of 10E-6 Torr, with a minimal physical contact pressure across the joint during joining. The joining layer began as 0.004 inch foil. The joint was not hermetic.

EDX analysis demonstrated that aluminum from the joint of FIG. 45 diffused into SiC ceramic. Also, EDX analysis demonstrated that Si had diffused into the aluminum brazing layer. The SiC was therefore not in the group of non-diffusing ceramics which included the other ceramics mentioned above.

Figure 6:
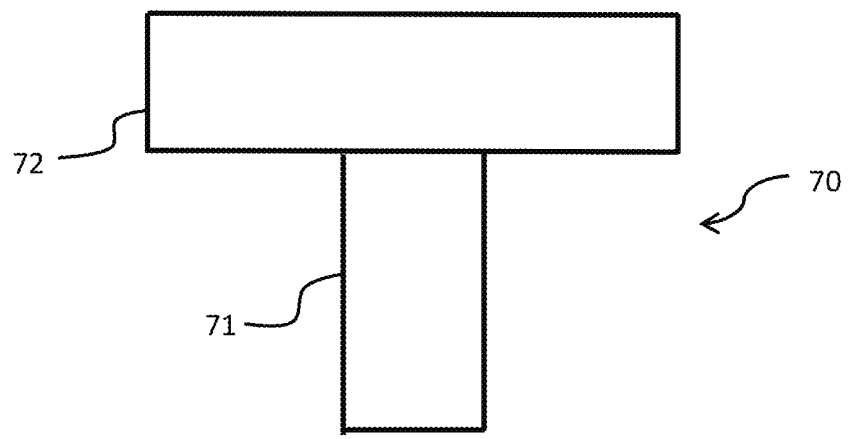
FIG. 6 is a sketch of an illustrative view of a joined ceramic assembly according to some embodiments of the present invention.

FIG. 6 illustrates an exemplary joined ceramic assembly 70. In some aspects, the joined ceramic assembly 70 is composed of a ceramic, such as aluminum nitride. Other materials, such as alumina, zirconia, or beryllium oxide, may be used. In some aspects, a first ceramic piece 72 may be aluminum nitride and a second ceramic piece 71 may be aluminum nitride, zirconia, alumina, or other ceramic. In some present processes, the joined ceramic assembly 70 components may first be manufactured individually in an initial process involving a process oven wherein the first piece 72 and the second piece 71 are formed.

Figure 7:
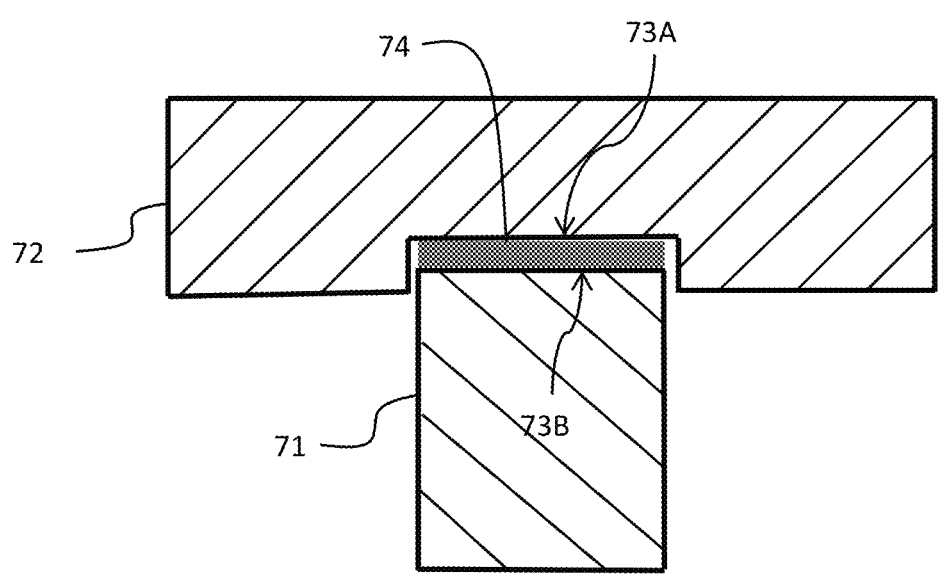
FIG. 7 is a cross-sectional view of a joined ceramic assembly according to some embodiments of the present invention.

FIG. 7 shows a cross section of an embodiment of a joint in which a first ceramic piece 72 is joined to a second ceramic piece 71, which may be made of the same or a different material, for example. A joining material, such as braze filler material 74, may be included, which can be selected from the combinations of braze materials or binders described herein and may be delivered to the joint according to the methods described herein. With respect to the joint depicted in FIG. 7, the first ceramic piece 72 is positioned such that a joint interface surface 73A of the first ceramic piece 72 abuts the second ceramic piece 71 along its joint interface surface 73,B with only the braze filler interposed between the surfaces to be joined. The thickness of the joint is exaggerated for clarity of illustration. In some embodiments, a recess may be included in one of the mating pieces, the first ceramic piece 72 in this example, which allows the other mating piece to reside within the recess.

Figure 8:
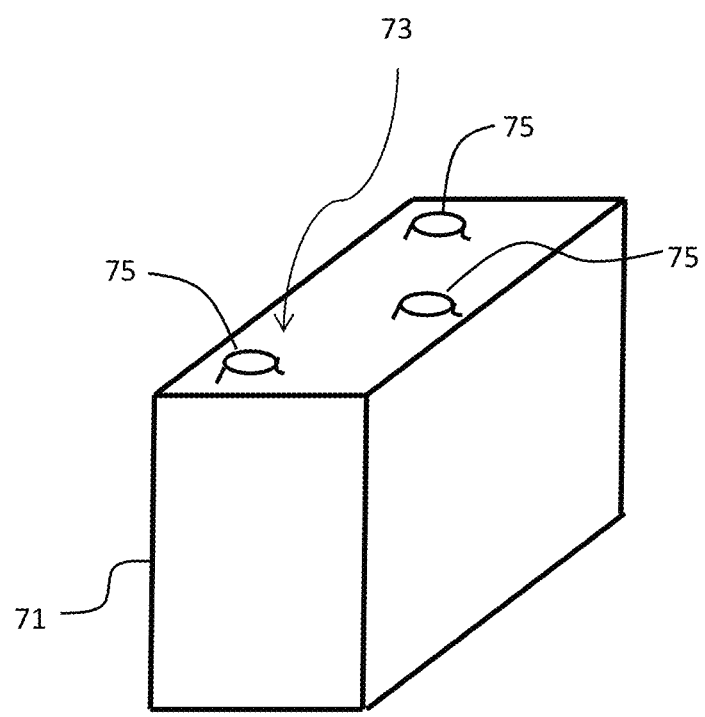
FIG. 8 is a perspective view of a ceramic piece with standoff mesas according to some embodiments of the present invention.
Figure 51:
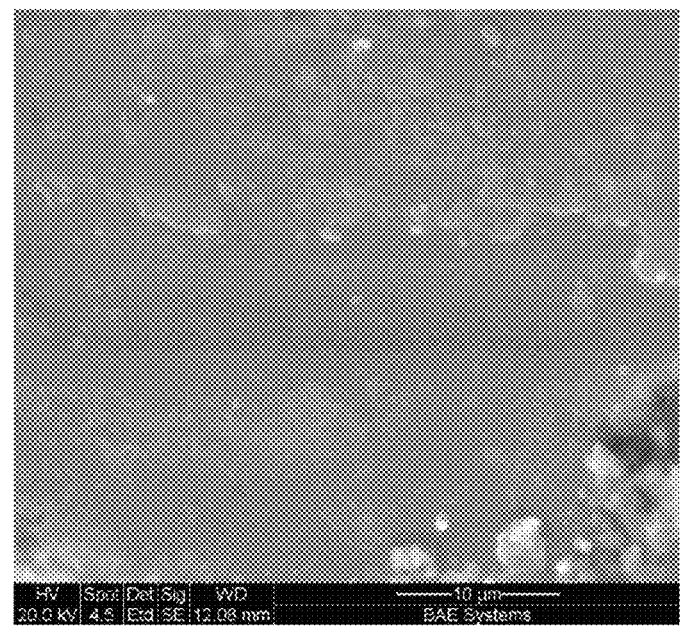
FIG. 51 is a SEM cross-sectional view of a joint according to some embodiments of the present invention.

An embodiment as illustrated in FIG. 7 may include a plurality of standoffs adapted to maintain a minimum braze layer thickness. In some embodiments, as seen in FIG. 8, one of the ceramic pieces, such as the second ceramic piece 71, may utilize a plurality of standoffs mesas 75 on the end 73B of the second ceramic piece 71 which is to be joined to the first ceramic piece 72. The mesas 75 may be part of the same structure as the second ceramic piece 71, and may be formed by machining away structure from the piece, leaving the mesas. The mesas 75 may abut the end 73A of the first ceramic piece 72 after the joining process. In some embodiments, the mesas may be used to create a minimum braze layer thickness for the joint. In other embodiments, the minimum braze layer thickness for the joint is created by incorporating powdered material into the braze layer filler material. The largest particle size of that incorporated powder material determines the minimum joint thickness. The powdered material may be mixed with powdered braze layer filler material, or painted onto the ceramic joint surface, or painted onto the braze layer filler foil of appropriate thickness, or incorporated directly into the braze layer filler material foil of appropriate thickness. In some embodiments, the braze layer material, prior to brazing, will be thicker than the distance maintained by the mesas or powder particles between the shaft end and the plate. In some embodiments, other methods may be used to establish a minimum braze layer thickness. In some embodiments, ceramic spheres may be used to establish a minimum braze layer thickness. In some aspects, the joint thickness may be slightly thicker than the dimension of the standoffs, or other minimum thickness determining device, as not quite all of the braze material may be squeezed out from between the standoffs and the adjacent interface surface. In some aspects, some of the aluminum braze layer may be found between the standoff and the adjacent interface surface. In some embodiments, the brazing material may be 0.006 inches thick prior to brazing with a completed joint minimum thickness of 0.004 inches. The brazing material may be aluminum with 0.4 Wt. % Fe. In some embodiments, the brazing material may be 0.004 inches thick prior to brazing and with a completed joint thickness of 0.0035 inches. Braze layers may be significantly thinner, and in some aspects the joining interfaces may be smoothed or polished to allow for a very thinner brazing layer. FIG. 51 illustrates a 4 micron braze layer which resulted in a hermetic joint when brazing polished AlN pieces. The thin braze layer is seen as a horizontal layer in the image. No diffusion is observed.

Figure 9:
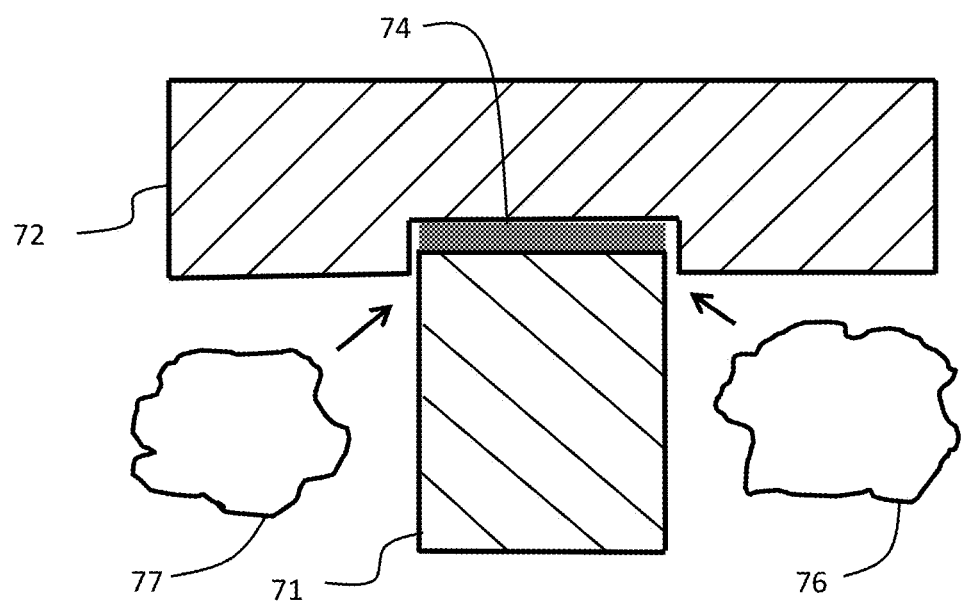
FIG. 9 is a cross-sectional view of a joint bridging different atmospheres according to some embodiments of the present invention.

As seen in FIG. 9, the brazing material may bridge between two distinct atmospheres, both of which may present significant problems for prior brazing materials. On a first surface of the joint, the brazing material may need to be compatible with the processes occurring, and the environment 77 present, in the semiconductor processing chamber in which the joined ceramic assembly is to be used. On a second surface of the joint, the brazing material may need to be compatible with a different atmosphere 76, which may be an oxygenated atmosphere. Prior brazing materials used with ceramics have not been able to meet both of these criteria. For example, braze elements containing copper, silver, or gold may interfere with the lattice structure of a silicon wafer being processed in a chamber with the joined ceramic, and are thus not appropriate. However, in some cases, a surface of the brazed joint may see a high temperature, and an oxygenated atmosphere. The portion of the braze joint which would be exposed to this atmosphere will oxidize, and may oxidize inwardly into the joint, resulting in a failure of the hermiticity of the joint. In addition to structural attachment, the joint between joined ceramic pieces to be used in semiconductor manufacturing must be hermetic in many, if not most or all, uses.

A braze material which will be compatible with both of the types of atmospheres described above when they are seen on both sides across a joint in such a device is aluminum. Aluminum has a property of forming a self-limiting layer of oxidized aluminum. This layer is generally homogenous, and, once formed, prevents or significantly limits additional oxygen or other oxidizing chemistries (such a fluorine chemistries) penetrating to the base aluminum and continuing the oxidation process. In this way, there is an initial brief period of oxidation or corrosion of the aluminum, which is then substantially stopped or slowed by the oxide (or fluoride) layer which has been formed on the surface of the aluminum. The braze material may be in the form of a sheet, a powder, a thin film, or be of any other form factor suitable for the brazing processes described herein. For example, the brazing layer may be a sheet having a thickness ranging from 0.00019 inches to 0.011 inches or more. In some embodiments, the braze material may be a sheet having a thickness of approximately 0.0012 inches. In some embodiments, the braze material may be a sheet having a thickness of approximately 0.006 inches. In some embodiments, the braze layer may have a thickness of 0.004 inches. Typically, alloying constituents (such as magnesium, for example) in aluminum are formed as precipitates in between the grain boundaries of the aluminum. While they can reduce the oxidation resistance of the aluminum bonding layer, typically these precipitates do not form contiguous pathways through the aluminum, and thereby do not allow penetration of the oxidizing agents through the full aluminum layer, and thus leaving intact the self-limiting oxide-layer characteristic of aluminum which provides its corrosion resistance. In the embodiments of using an aluminum alloy which contains constituents which can form precipitates, process parameters, including cooling protocols, would be adapted to minimize the precipitates in the grain boundary. For example, in one embodiment, the braze material may be aluminum having a purity of at least 99.5%. In some embodiments, a commercially available aluminum foil, which may have a purity of greater than 92%, may be used. In some embodiments, alloys are used. These alloys may include Al-5 w % Zr, Al-5 w % Ti, commercial alloys #7005, #5083, and #7075. These alloys may be used with a joining temperature of 1100 C in some embodiments. These alloys may be used with a temperature between 800 C and 1200 C in some embodiments. These alloys may be used with a lower or higher temperature in some embodiments.

The non-susceptibility of this group of ceramics to diffusion with aluminum under the conditions of processes according to embodiments of the present invention results in the preservation of the material properties, and the material identity, of the ceramic after the brazing step in the manufacturing of the plate and shaft assembly.

In some embodiments, the joining process is performed in a process chamber adapted to provide very low pressures. Joining processes according to embodiments of the present invention may require an absence of oxygen in order to achieve a hermetically sealed joint. In some embodiments, the process is performed at a pressure lower than 1×10E-4 Torr. In some embodiments, the process is performed at a pressure lower than 1×10E-5 Torr. In some embodiments, further oxygen removal is achieved with the placement of zirconium or titanium in the process chamber. For example, a zirconium inner chamber may be placed around the pieces which are to be joined.

In some embodiments, atmospheres other than vacuum may be used to achieve a hermetic seal. In some embodiments, argon (Ar) atmosphere may be used to achieve hermetic joints. In some embodiments, other noble gasses are used to achieve hermetic joints. In some embodiments, hydrogen (H2) atmosphere may be used to achieve hermetic joints.

The wetting and flow of the brazing layer may be sensitive to a variety of factors. The factors of concern include the braze material composition, the ceramic composition, the susceptibility of the ceramic to diffusion by aluminum, the chemical makeup of the atmosphere in the process chamber, especially the level of oxygen in the chamber during the joining process, the temperature, the time at temperature, the thickness of the braze material, the surface characteristics of the material to be joined, the geometry of the pieces to be joined, the physical pressure applied across the joint during the joining process, and/or the joint gap maintained during the joining process.

In some embodiments, the surfaces of the ceramic may undergo a metallization prior to the placement of the ceramic pieces into a chamber for joining. The metallization may be a frictional metallization in some embodiments. The frictional metallization may comprise the use of an aluminum rod. A rotary tool may be used to spin the aluminum rod over areas which will be adjacent to the brazing layer when the piece is joined. The frictional metallization step may leave some aluminum in the surface of the ceramic piece. The frictional metallization step may alter the ceramic surface somewhat, such as by removing some oxides, such that the surface is better adapted for wetting of the brazing material.

An example of a brazing method for joining together first and second ceramic objects may include the steps of bringing the first and second objects together with a brazing layer selected from the group consisting of aluminum and an aluminum alloy disposed between the first and second ceramic objects, heating the brazing layer to a temperature of at least 800 C, and cooling the brazing layer to a temperature below its melting point so that the brazing layer hardens and creates a hermetic seal so as to join the first member to the second member. Another example of a brazing method for joining together first and second ceramic objects, wherein the ceramics are of a group consisting of aluminum nitride, alumina, beryllium oxide, and zirconia, may include the steps of bringing the first and second objects together with a brazing layer selected from the group consisting of aluminum and an aluminum alloy disposed between the first and second ceramic objects, heating the brazing layer to a temperature of at least 770 C, and cooling the brazing layer to a temperature below its melting point so that the brazing layer hardens and creates a hermetic seal so as to join the first member to the second member. Various geometries of braze joints may be implemented according to methods described herein.

A joining process according to some embodiments of the present invention may comprise some or all of the following steps. Two or more ceramic pieces are selected for joining. In some embodiments, a plurality of pieces may be joined using a plurality of joining layers in the same set of process steps, but for the sake of clarity of discussion two ceramic pieces joined with a single joining layer will be discussed herein. The ceramic pieces may be of aluminum nitride. The ceramic pieces may be of mono-crystalline or poly-crystalline aluminum nitride. The ceramic pieces may be selected from a group consisting of aluminum nitride, alumina, beryllium oxide, and zirconia, which is a group which demonstrates non-diffusability by aluminum. Other ceramics may be in this group. Portions of each piece have been identified as the area of each piece which will be joined to the other. In an illustrative example, a portion of the bottom of a ceramic plate structure will be joined to the top of a ceramic hollow cylindrical structure. The joining material may be a brazing layer comprising aluminum. In some embodiments, the brazing layer may be a commercially available aluminum foil of >99% aluminum content. The brazing layer may consist of a plurality of layers of foil in some embodiments.

In some embodiments, the specific surface areas which will be joined will undergo a pre-metallization step. This pre-metallization step may be achieved in a variety of ways. In one method, a frictional pre-metallization process is employed, using a rod of material, which may be 6061 aluminum alloy, may be spun with a rotary tool and pressed against the ceramic in the joint area, such that some aluminum may be deposited onto each of the two ceramic pieces in the area of the joint. In another method, PVD, CVD, electro-plating, plasma spray, or other methods may be used to apply the pre-metallization.

Prior to joining, the two pieces may be fixtured relative to each other to maintain some positional control while in the process chamber. The fixturing may also aid in the application of an externally applied load to create contact pressure between the two pieces, and across the joint, during the application of temperature. A weight may be placed on top of the fixture pieces such that contact pressure in applied across the joint. The weight may be proportioned to the area of the brazing layer. In some embodiments, the contact pressure applied across the joint may be in the range of approximately 2-500 psi onto the joint contact areas. In some embodiments the contact pressure may be in the range of 2-40 psi. In some embodiments, minimal pressure may be used. The contact pressure used at this step is significantly lower than that seen in the joining step using hot pressing/sintering as seen in prior processes, which may use pressures in the range of 2000-3000 psi.

In embodiments using mesas as standoffs, as seen in FIG. 8, the original thickness of the brazing layer prior to the application of heat is larger than the height of the mesas. As the brazing layer temperature reaches and exceeds the liquidus temperature, pressure across the brazing layer between the pieces being joined will cause relative motion between the pieces until the mesas on a first piece contact an interface surface on a second piece. At that point, contact pressure across the joint will no longer be supplied by the external force (except as resistance to repulsive forces within the brazing layer, if any). The mesas may prevent the brazing layer from being forced out of the joint area prior to the full wetting of ceramic pieces, and may thus allow better and/or full wetting during the joining process. In some embodiments, mesas are not used.

The fixtured assembly may then be placed in a process oven. The oven may be evacuated to a pressure of less than 5×10E-5 Torr. In some aspects, vacuum removes the residual oxygen. In some embodiments, a vacuum of lower than 1×10E-5 Torr is used. In some embodiments, the fixtured assembly is placed within a zirconium inner chamber which acts as an oxygen attractant, further reducing the residual oxygen which might have found its way towards the joint during processing. In some embodiments, the process oven is purged and re-filled with pure, dehydrated pure noble gas, such as argon gas, to remove the oxygen. In some embodiments, the process oven is purged and re-filled with purified hydrogen to remove the oxygen.

The fixture assembly is then subjected to increases in temperature, and a hold at the joining temperature. Upon initiating the heating cycle, the temperature may be raised slowly, for example 15C per minute to 200 C and then 20 C per minute thereafter, to standardized temperatures, for example, 600 C and the joining temperature, and held at each temperature for a fixed dwell time to allow the vacuum to recover after heating, in order to minimize gradients and/or for other reasons. When the braze temperature has been reached, the temperature can be held for a time to effect the braze reaction. In an exemplary embodiment, the dwell temperature may be 800 C and the dwell time may be 2 hours. In another exemplary embodiment, the dwell temperature may be 1000 C and the dwell time may be 15 minutes. In another exemplary embodiment, the dwell temperature may be 1150 and the dwell time may be 30-45 minutes. In some embodiments, the dwell temperature does not exceed a maximum of 1200 C. In some embodiments, the dwell temperature does not exceed a maximum of 1300 C. The dwell temperature may be in the range of 770 C and 1200 C in some embodiments. The dwell temperature may be in the range of 800 C and 1200 C in some embodiments. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation.

The use of too high of a temperature, for too long of a time period, may lead to voids forming in the joining layer as the result of significant aluminum evaporation. As voids form in the joining layer, the hermeticity of the joint may be lost. The process temperature and the time duration of the process temperature may be controlled such that the aluminum layer does not evaporate away, and so that a hermetic joint is achieved. The use of too low of a temperature has been found to result in a joint which is not hermetic. Standard brazing techniques use a braze temperature at or slightly above the melting point of the braze material. A temperature other than that standard brazing temperature is needed when joining according to aspects of the present invention. With proper temperature and process time duration control, in addition to the other process parameters described above, a continuous joint may be formed. A continuous joint achieved in accord with embodiments as described herein will result in a hermetic sealing of the parts, as well as a structural attachment.

The brazing material will flow and allow for wetting of the surfaces of the ceramic materials being joined. When a non-diffusing ceramic such as aluminum nitride, alumina, beryllium oxide, or zirconia is joined using aluminum brazing layers and in the presence of sufficiently low levels of oxygen and described herein, the joint is a hermetic brazed joint. This stands in contrast to the diffusion bonding seen in some prior ceramic joining processes.

In some embodiments, the pieces to be joined may be configured such that no pressure is placed across the brazing layer during brazing. For example, a post or shaft may be placed into a countersunk hole or recess in a mating piece. The countersink may be larger than the exterior dimension of the post or shaft. This may create an area around the post or shaft which then may be filled with aluminum, or an aluminum alloy. In this scenario, pressure placed between the two pieces in order to hold them during joining may not result in any pressure across the braze layer. Also, it may be possible to hold each piece in the preferred end position using fixturing such that little or no pressure is placed between the pieces at all.

Joined assemblies joined as described above result in pieces with hermetic sealing between the joined pieces. Such assemblies are then able to be used where atmosphere isolation is an important aspect in the use of the assemblies. Further, the portion of the joint which may be exposed to various atmospheres when the joined assemblies are later used in semi-conductor processing, for example, will not degrade in such atmospheres, nor will it contaminate the later semi-conductor processing.

Both hermetic and non-hermetic joints may join pieces strongly, in that significant force is needed to separate the pieces. However, the fact that a joint is strong is not determinative of whether the joint provides a hermetic seal. The ability to obtain hermetic joints may be related to the wetting of the joint. Wetting describes the ability or tendency of a liquid to spread over the surface of another material. If there is insufficient wetting in a brazed joint, there will be areas where there is no bonding. If there is enough non-wetted area, then gas may pass through the joint, causing a leak. Wetting may be affected by the pressure across the joint at different stages in the melting of the brazing material. The use of mesa standoffs, or other standoff device such as the insertion of ceramic spheres or powder particles of appropriate diameter, to limit the compression of the brazing layer beyond a certain minimum distance may enhance the wetting of the areas of the joint. Careful control of the atmosphere seen by the brazing element during the joining process may enhance the wetting of the areas of the joint. In combination, careful control of the joint thickness, and careful control of the atmosphere used during the process, may result in a complete wetting of the joint interface area that is not able to be achieved with other processes. Further, the use of a brazing layer that is of a proper thickness, which is thicker than the mesa standoff height, in conjunction with the other referenced factors, may result in a very well wetted, hermetic, joint. Although a variety of joining layer thicknesses may be successful, an increased thickness of the joining layer may enhance the success rate of the joint's hermetic aspect.

Acoustic imaging of the joint allows for viewing of the uniformity of the joint, and for determination of whether voids and/or passages exist in the joint. The resulting images of joints tested to be hermetic show uniform, voidless joints, while images of joints tested to be non-hermetic show voids, or large non-bonded areas, in the ceramic-braze layer interface area. In the examples seen in the acoustic images, rings have been bonded to a flat surface. The rings are typically 1.40 inches outer diameter, 1.183 inches interior diameter, with a joint interface area of approximately 0.44 square inches. The bonding of rings to a flat surface are exemplary of the joining of a hollow shaft to a plate, as may be seen in the assembly of a heater, for example.

Figure 10:
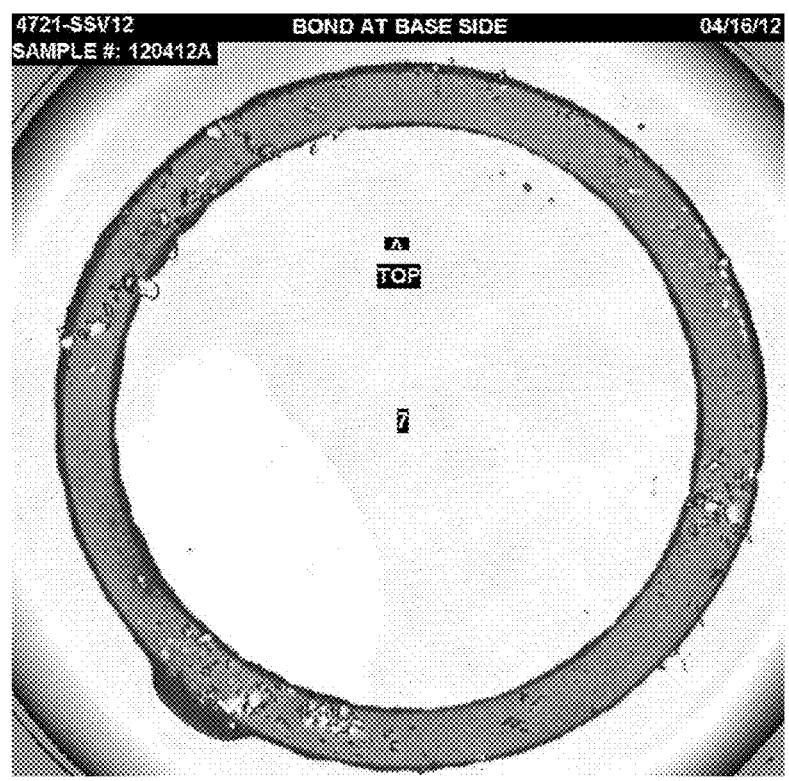
FIG. 10 is a view representing the joint integrity of a joint.

FIG. 10 is an image created using acoustic sensing of the joint integrity of a joint created according to the present invention. The joint was between two pieces of poly-crystalline aluminum nitride. The brazing layer material was three layers each of 0.0006" thickness of 99.8% aluminum foil in concert with a frictional metallization step using 6061 Aluminum alloy. The joining temperature was 1100 C held for 45 minutes. The joining was done within a zirconium box in a process chamber held at pressure lower than 1×10E-5 Torr. No standoffs were used. The image displays a solid dark color in locations where there is good wetting onto the ceramic. The white/light areas are indicative of a void at the joining surface of the ceramic. As seen, there is good and sufficient integrity of the joint. This joint was hermetic. Hermeticity was verified by having a vacuum leak rate of <1×10E-9 sccm He/sec; as verified by a standard commercially available mass spectrometer helium leak detector.

Figure 11:
FIG. 11 is a view representing the joint integrity of a joint.

FIG. 11 is an image created using acoustic sensing of the joint integrity of a joint created according to the present invention. The joint was between two pieces of poly-crystalline aluminum nitride. The brazing material was two layers of 99.8% aluminum foil with a frictional metallization step using 6061 Aluminum alloy. The joining temperature was 1100 C held for 45 minutes. The joining was done within a zirconium box in a process chamber held at pressure lower than 1×10E-5 Torr. The image displays a solid dark color in locations where there is good wetting onto the ceramic. The white/light areas are indicative of a void at the joining surface of the ceramic. As seen, there is good and sufficient integrity of the joint. This joint was hermetic.

Figure 12:
FIG. 12 is a view representing the joint integrity of a joint.

FIG. 12 is an image created using acoustic sensing of the joint integrity of a joint. The joint was between two pieces of poly-crystalline aluminum nitride. The brazing material was three layers of 99.8% aluminum foil without a frictional metallization step. The joining temperature was 1100 C held for 45 minutes. The joining was done within a zirconium box in a process chamber held at pressure lower than 1×10E-5 Torr. The image displays a solid dark color in locations where there is good wetting onto the ceramic. The white/light areas are indicative of a void at the joining surface of the ceramic. As seen, there is integrity of the joint. This joint was hermetic. However, it can be seen that some areas of voids come close together from each side. The joint maintained hermetic integrity but more voids were apparent than in the cases with frictional metallization described above.

Figure 13:
FIG. 13 is a view representing the joint integrity of a joint.

FIG. 13 is an image created using acoustic sensing of the joint integrity of a joint. The joint was between two pieces of poly-crystalline aluminum nitride. In this joint, mesa standoffs were used to maintain a minimum joint thickness. Three mesas were on the circular shaft element. The mesas were 0.004 inches high. The brazing material was aluminum of >99%. The brazing layer was 0.006 inches thick prior to brazing. The joining temperature was 1200 C held for 30 minutes. The joining was done in a process chamber held at pressure lower than 1×10E-5 Torr. An applied load of 18 pounds was used to apply pressure across the joint. The standoffs prevented the joint thickness from becoming lower than the standoff height. In this case of using a set of standoff mesas, the wetting of the joint is seen to be superior to that seen in the prior joint images. There is full wetting of the joint and an absence of voids. This joint was hermetic. The use of the standoff mesas to create a minimum joint thickness, in conjunction with the high vacuum, results in a joint that is of the very high quality that is demonstrated by the acoustic image. The location of the three standoff mesas is indicated by the three dots seen within the joint, spread equally radially.

Figure 14:
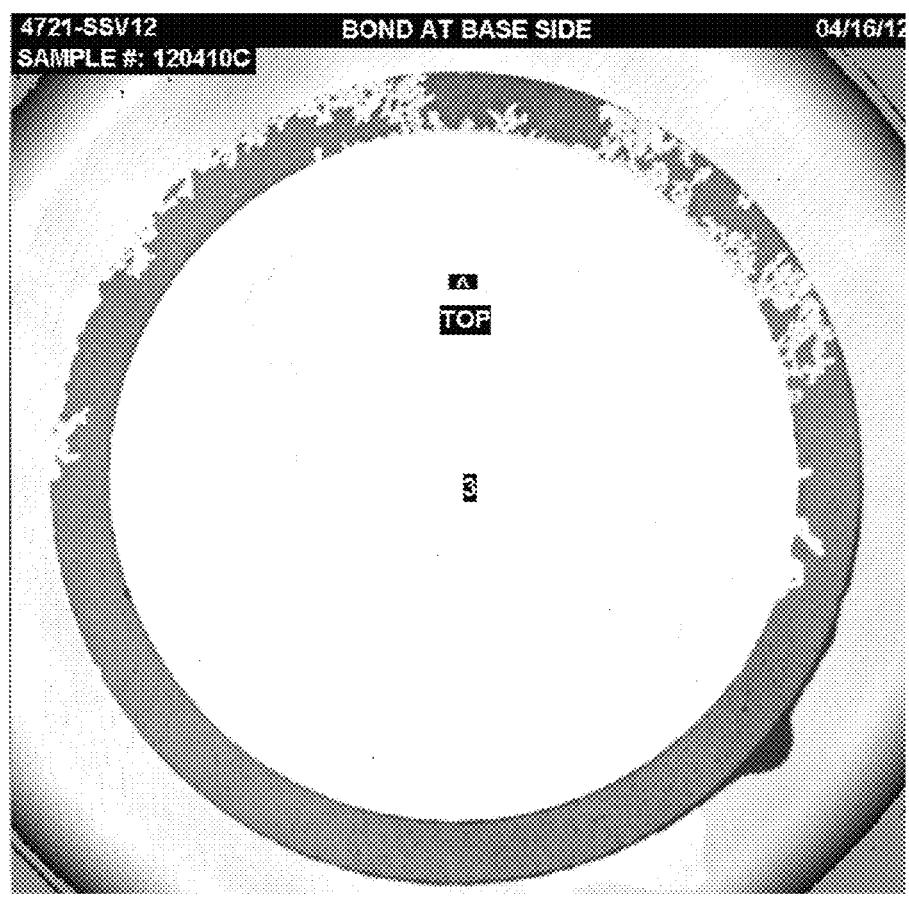
FIG. 14 is a view representing the joint integrity of a joint.

FIG. 14 is an image created using acoustic sensing of the joint integrity of a joint. The joint was between two pieces of poly-crystalline aluminum nitride. The brazing material was two layers of 99.8% aluminum foil without a frictional metallization step. There were no standoffs determining the minimum joint thickness. The joining temperature was 1100 C held for 45 minutes. The joining was done within a zirconium box in a process chamber held at pressure lower than 1×10E-5 Torr. The image displays a solid dark color in locations where there is good wetting onto the ceramic. The white/light areas are indicative of a void at the joining surface of the ceramic. This joint was not hermetic. The brazing layer was thinner than in the example of FIG. 12. As described above, the thickness of the brazing material is one of the factors which determines whether a joining process will result reliably in a hermetically sealed joint.

Figure 15:
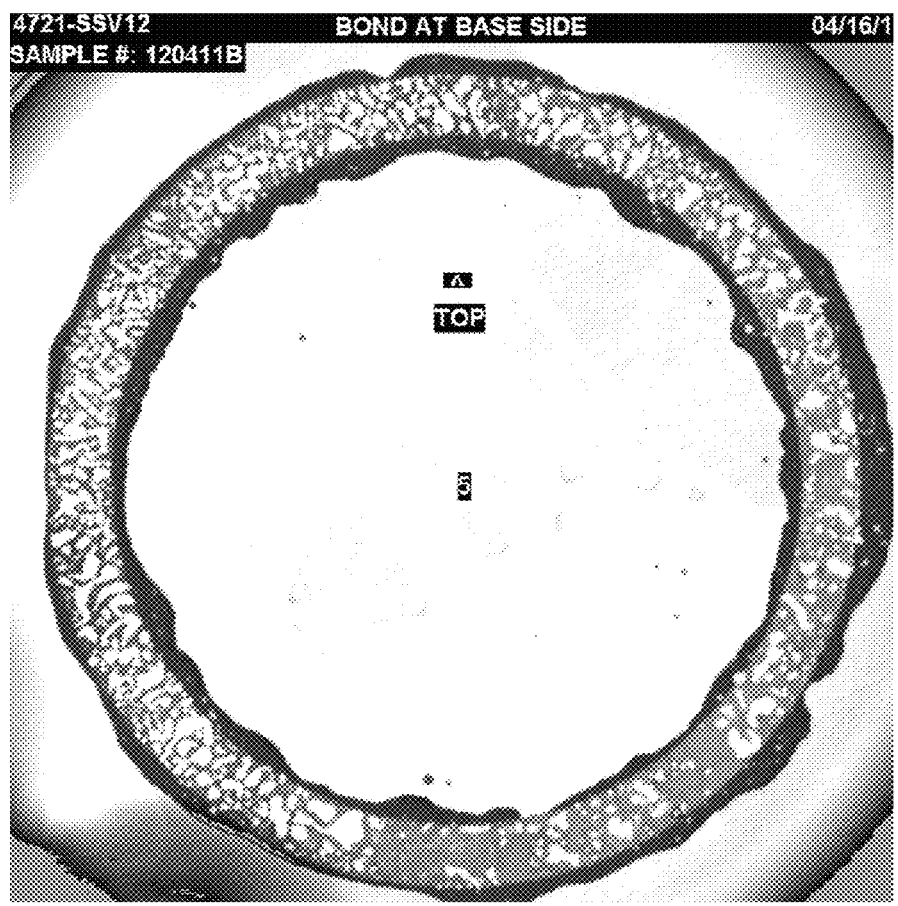
FIG. 15 is a view representing the joint integrity of a joint.

FIG. 15 is an image created using acoustic sensing of the joint integrity of a joint. The joint was between two pieces of poly-crystalline aluminum nitride. The brazing material was three layers of 7075 aluminum alloy foil without a frictional metallization step. The joining temperature was 1100 C held for 45 minutes. The joining was done without using a zirconium box, in a process chamber held at pressure lower than 1×10E-5 Torr. The image displays a solid dark color in locations where there is good wetting onto the ceramic. The white/light areas are indicative of a void at the joining surface of the ceramic. This joint was hermetic, although a multiplicity of voids is seen. As described above, the amount of oxygen available to the joint under temperature is one of the factors which determines whether a joining process will result in a hermetically sealed joint. FIGS. 14 and 15 are examples of how a process using multiple thin layers for brazing, and without standoff mesas, even in high vacuum, may result in non-uniform wetting. Although the joint is hermetic, the lack of wetting and the significant amount of voids indicate that this process approach may not be as reliable as the use of a single piece brazing element. In contrast, FIG. 13 illustrates the complete wetting seen with the use of standoff mesas, a single piece brazing element, and a high vacuum atmosphere.

Figure 16:
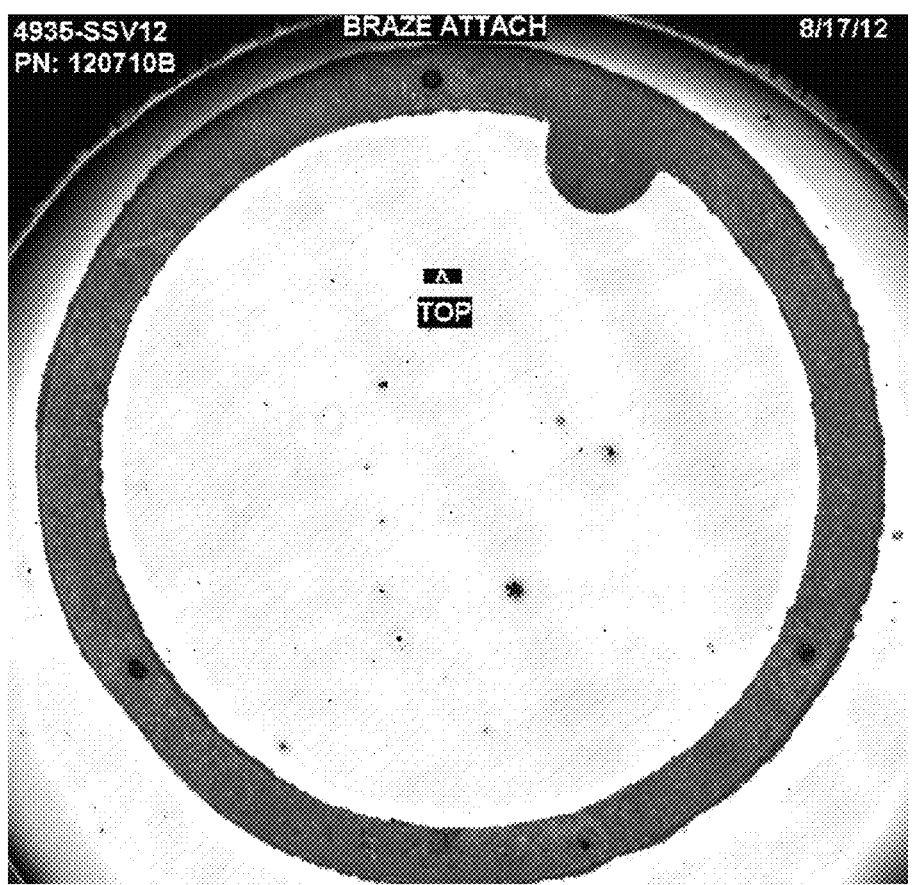
FIG. 16 is a view representing the joint integrity of a joint.

FIG. 16 is an image created using acoustic sensing of the joint integrity of a joint. The joint was between two pieces of poly-crystalline aluminum nitride. In this joint, mesa standoffs were used to maintain a minimum joint thickness. Three mesas were on the circular shaft element. The mesas were 0.004 inches high. The brazing material was aluminum of >99%. The brazing layer was 0.006 inches thick prior to brazing. The joining temperature was 1150 C held for 30 minutes. The joining was done in a process chamber held at atmospheric pressure in an argon gas environment. The supplied argon was 99.999% purity, and was passed through a dehumidifier prior to entering the process chamber. A flow rate of several slm (standard liters per minute) was used during the braze process. The standoffs prevented the joint thickness from becoming thinner than the standoff height. In this case of using a set of standoff mesas, the wetting of the joint is seen to be very uniform and complete. The location of the three standoff mesas is indicated by the three dots seen within the joint, spread equally radially. There is full wetting of the joint and a near absence of voids. This joint was hermetic. The use of the standoff mesas to create a minimum joint thickness, in conjunction with the high purity argon, results in a joint that is of the very high quality that is demonstrated by the acoustic image.

Figure 17:
FIG. 17 is a view representing the joint integrity of a joint.

FIG. 17 is an image created using acoustic sensing of the joint integrity of a joint. The joint was between two pieces of poly-crystalline aluminum nitride. In this joint, mesa standoffs were used to maintain a minimum joint thickness. Three mesas were on the circular shaft element. The mesas were 0.004 inches high. The brazing material was aluminum of >99%. The brazing layer was 0.006 inches thick prior to brazing. The joining temperature was 1150 C held for 30 minutes. The joining was done in a process chamber held at atmospheric pressure in a hydrogen gas environment. The supplied hydrogen gas was 99.999% purity, and further was passed through a purifier prior to entering the process chamber. A flow rate of several slm was used during the braze process. The standoffs prevented the joint thickness from becoming lower than the standoff height. The location of the three standoff mesas is indicated by the three dots seen within the joint, spread equally radially. In this case of using a set of standoff mesas, the wetting of the joint is seen to be very uniform and complete. There is full wetting of the joint and a near absence of voids. This joint was hermetic. The use of the standoff mesas to create a minimum joint thickness, in conjunction with the high purity hydrogen gas, results in a joint that is of the very high quality that is demonstrated by the acoustic image.

Figure 18:
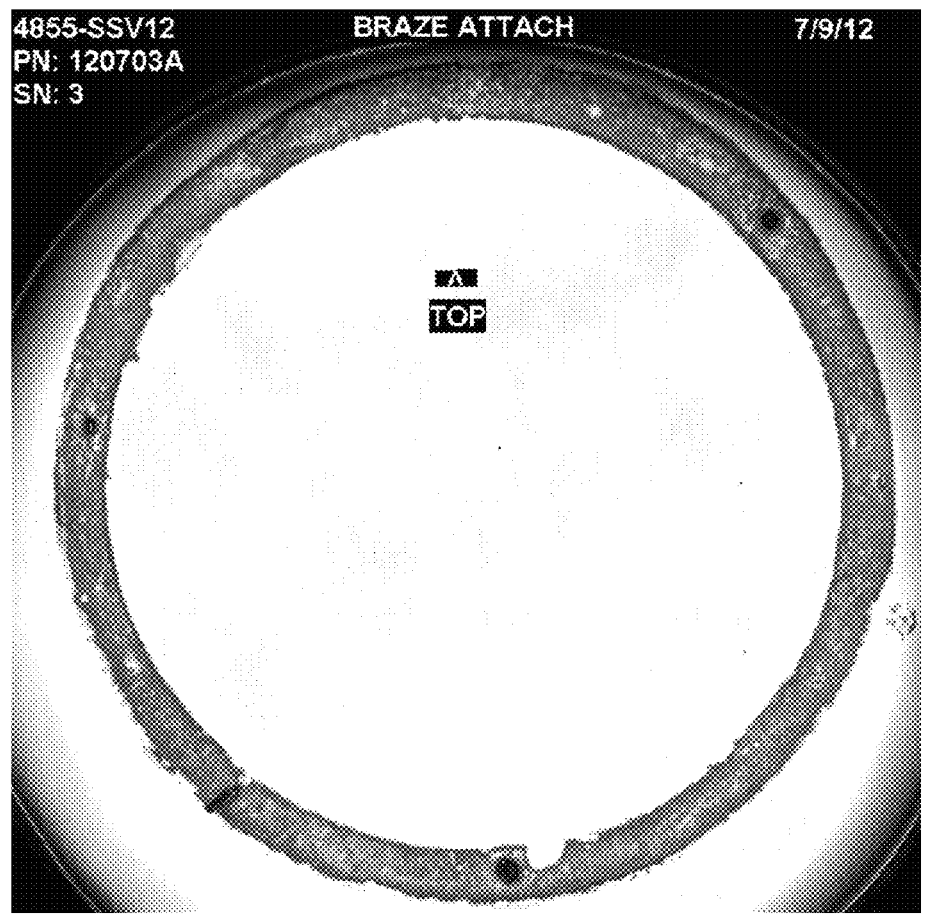
FIG. 18 is a view representing the joint integrity of a joint.

FIG. 18 is an image created using acoustic sensing of the joint integrity of a joint. The joint was between two pieces of poly-crystalline aluminum nitride. In this joint, mesa standoffs were used to maintain a minimum joint thickness. Three mesas were on the circular shaft element. The mesas were 0.004 inches high. The brazing material was aluminum of >99%. The brazing layer was 0.006 inches thick prior to brazing. The joining temperature was 1150 C held for 30 minutes. The joining was done in a process chamber held at atmospheric pressure in a nitrogen gas environment. The supplied nitrogen gas was 99.999% purity. A flow rate of several slm was used during the braze process. The standoffs prevented the joint thickness from becoming lower than the standoff height. In this case, the wetting of the joint is seen to be not uniform and not complete. There is not full wetting of the joint, and there are observable voids. This joint was not hermetic. The use of high purity nitrogen gas results in a joint that is not of the very high quality that is demonstrated by the acoustic images of the vacuum, argon, and hydrogen gasses.

Figure 19:
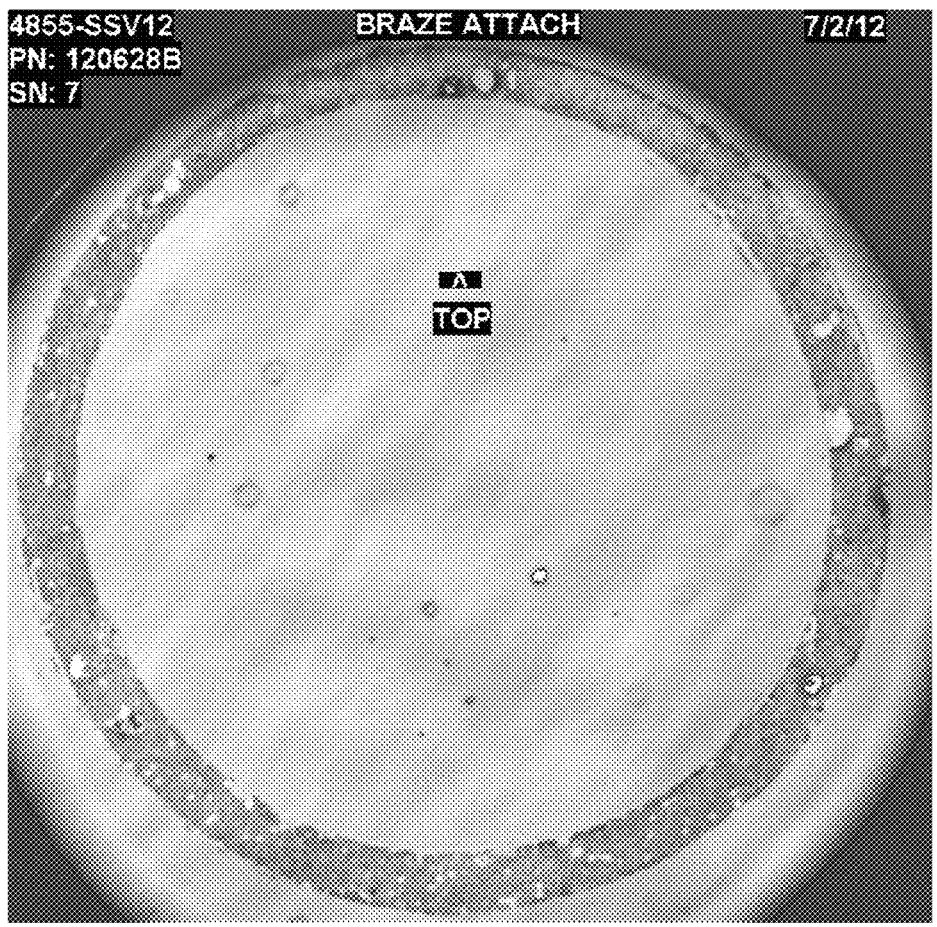
FIG. 19 is a view representing the joint integrity of a joint.

FIG. 19 is an image created using acoustic sensing of the joint integrity of a joint. The joint was between two pieces of poly-crystalline aluminum nitride. In this joint, mesa standoffs were used to maintain a minimum joint thickness. Three mesas were on the circular shaft element. The mesas were 0.004 inches high. The brazing material was aluminum of >99%. The brazing layer was 0.006 inches thick prior to brazing. The joining temperature was 1100 C held for 30 minutes. The joining was done in a process chamber held at atmospheric pressure in a regular air atmosphere environment. The standoffs prevented the joint thickness from becoming lower than the standoff height. In this case, the wetting of the joint is seen to be not uniform and not complete. There is not full wetting of the joint, and there are observable voids. This joint was not hermetic. The use of regular atmosphere results in a joint that is not of the very high quality that is demonstrated by the acoustic images of the vacuum, argon, and hydrogen gasses.

FIGS. 18 (nitrogen) and 19 (air) illustrate that the use of standoff mesas alone may not result in a high quality, fully wetted, voidless, and hermetic joint. FIG. 13 (high vacuum) illustrates that the use of standoff mesas and high vacuum results in a high quality, fully wetted, voidless, and hermetic joint. This relatively low temperature joining process using aluminum as the brazing layer, and using process parameters according to embodiments of the present invention, results in a high quality hermetic joining of components, especially ceramic components. Processes according to embodiments of the present invention allow for low cost high quality joining of ceramic components, and also allow for disjoining of the components at a later time, if desired. FIGS. 16 (argon) and 17 (hydrogen) illustrate that non-vacuum processes can result in a high quality hermetic joint if the atmosphere is carefully and properly controlled. In such embodiments, non-oxidizing gasses such as hydrogen, or high purity noble gasses, are used to displace oxygen and nitrogen in the chamber.

The presence of a significant amount of oxygen or nitrogen during the brazing process may create reactions which interfere with full wetting of the joint interface area, which in turn may result in a joint that is not hermetic. Without full wetting, non-wetted areas are introduced into the final joint, in the joint interface area. When sufficient contiguous non-wetted areas are introduced, the hermeticity of the joint is lost.

The presence of nitrogen may lead to the nitrogen reacting with the molten aluminum to form aluminum nitride, and this reaction formation may interfere with the wetting of the joint interface area. Similarly, the presence of oxygen may lead to the oxygen reacting with the molten aluminum to form aluminum oxide, and this reaction formation may interfere with the wetting of the joint interface area. Using a vacuum atmosphere of pressure lower than 5×10-5 Torr has been shown to have removed enough oxygen and nitrogen to allow for fully robust wetting of the joint interface area, and hermetic joints. In some embodiments, use of higher pressures, including atmospheric pressure, but using non-oxidizing gasses such as hydrogen or pure noble gasses such as argon, for example, in the process chamber during the brazing step has also led to robust wetting of the joint interface area, and hermetic joints. In order to avoid the oxygen reaction referred to above, the amount of oxygen in the process chamber during the brazing process must be low enough such that the full wetting of the joint interface area is not adversely affected. In order to avoid the nitrogen reaction referred to above, the amount of nitrogen present in the process chamber during the brazing process must be low enough such that the full wetting of joint interface area is not adversely affected.

The selection of the proper atmosphere during the brazing process, coupled with maintaining a minimum joint thickness, may allow for the full wetting of the joint. Conversely, the selection of an improper atmosphere may lead to poor wetting, voids, and lead to a non-hermetic joint. The appropriate combination of controlled atmosphere and controlled joint thickness along with proper material selection and temperature during brazing allows for the joining of materials with hermetic joints.

The temperature needed to result in a properly wetted and hermetic joint is a temperature higher than a standard brazing temperature. The following data illustrates the temperature zone wherein the joint transforms from a non-hermetic to a hermetic joint when using non-diffusing ceramics, and in accord with other aspects as described herein.

| Temperature—° C. | Hermeticity |
|---|---|
| 675 | Leaks |
| 675 | Leaks |
| 675 | Leaks |
| 675 | Leaks |
| 750 | Leaks |
| 750 | Leaks |
| 750 | Leaks |
| 750 | Leaks |
| 760 | Leaks |
| 770 | Hermetic |
| 780 | Hermetic |
| 790 | Hermetic |
| 800 | Hermetic |
| 800 | Hermetic |
| 900 | Hermetic |

The table above illustrates that there is a transition temperature above which a hermetic joint may be achieved when non-diffusing ceramics are joined according to the other aspects of the present invention. When rounded to the nearest 50 C increment, the minimum temperature required would be 800 C. When rounded to the nearest 10 C increment, the minimum temperature required would be 770 C.

Diffusion, of aluminum into a ceramic, for example, is a thermally activated process driven by concentration differences and obeys Fick's Laws. Diffusivity is given by:

$$D=D_o*\exp(-Q_d/k_B*T)$$

Where
D=diffusivity
$D_0$=temperature independent constant
$Q_d$=Activation energy for diffusion
$k_B$=Boltzmann's constant
T=temperature The activation energy may be the most important quantity here. For ceramic compounds with a quite large Q, diffusion may be unlikely in the compound.

FIGS. 46-50 illustrate the joint integrity of joints formed at different temperatures near the transition temperature wherein the joint becomes a fully wetted hermetic seal. These figures illustrate the temperature sensitivity of the process such that a temperature significantly higher than the melting point of the brazing material must be used in order to achieve a hermetic joint. The joints seen in FIGS. 46-50 all underwent the same process with the exception of temperature. For each joint, the joint joined an AlN ring to an AlN plate. Each joint began with an Al brazing layer of 99.99% Al foil beginning at 0.004 inches thick, with a completed joint thickness of 0.0035 inches. The atmosphere was vacuum at 10E-6 Torr, and the temperature was held for 10 minutes. The joint of FIG. 46 was joined at 750 C and was not hermetic. Wetting was not complete and voids are seen. The joint of FIG. 47 was joined at 760 C and was not hermetic. Wetting was not complete and voids are seen. The joint of FIG. 48 was joined at 770 C and the wetting is substantially complete. The joint was hermetic. The joint of FIG. 49 was joined at 780 C and the wetting is complete, and the joint was hermetic. The joint of FIG. 50 was joined at 790 C and the wetting is complete, and the joint was hermetic.

Based upon the data referred to herein, a temperature of greater than 770 C may be used to join according to embodiments of the present invention. Temperatures in the range of 770 C to 1200 C may be used to join according to embodiments of the present invention.

Another advantage of the joining method as described herein is that joints made according to some embodiments of the present invention may allow for the disassembly of components, if desired, to repair or replace one of those two components. Because the joining process did not modify the ceramic pieces by diffusion of a joining layer into the ceramic, the ceramic pieces are thus able to be re-used.

Prior methods of manufacturing components such as heaters and electrostatic chucks using ceramic materials have required process steps with specialized atmospheres (such as vacuum, inert, or reducing atmospheres), very high temperatures, and very high contact pressures. The contact pressures may be applied using presses, and these presses may be adapted to operate inside a process chamber that provides the specialized atmospheres, such as vacuum, and high temperatures. This may require specialized presses and fixturing made of refractory materials, such as graphite, within the process chamber. The cost and complexity of these setups may be very high. In addition, the larger the component that is required to be pressed, the fewer components can be put into such a process oven. As the duration of the processes in the process ovens with presses may be measured in days, and given the large expense associated with both the manufacture of and the running of the process ovens/presses, a reduction in the number of steps which use these process ovens which provide very high temperature, special atmospheres, and very high contact pressures during the manufacture of components will result in great savings.

Figure 20:
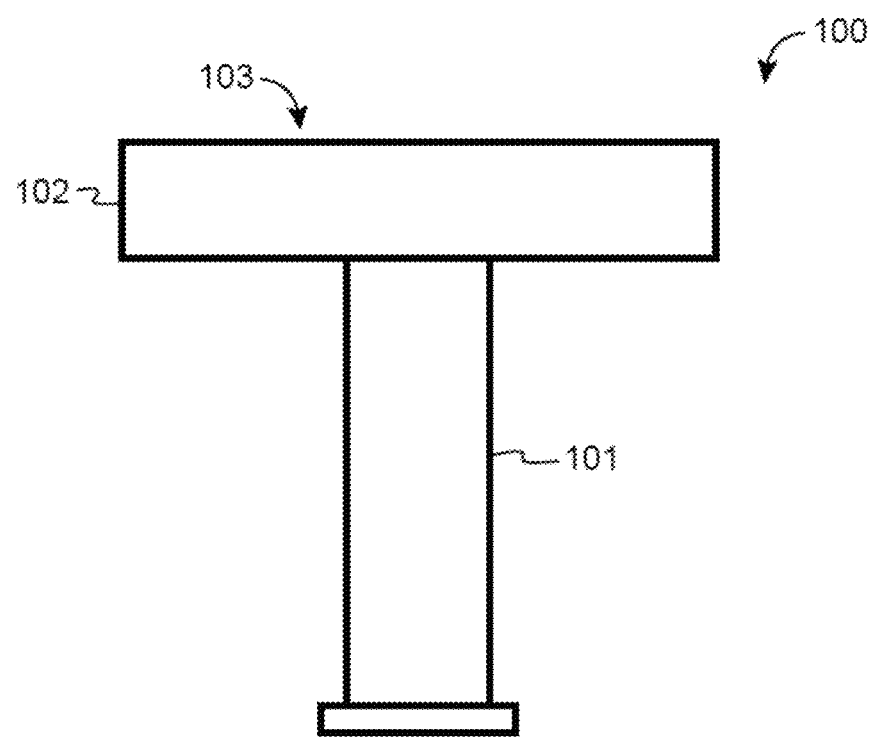
FIG. 20 is a view of a plate and shaft device used in semiconductor processing according to some embodiments of the present invention.

FIG. 20 illustrates an exemplary plate and shaft device 100, such as a heater, used in semiconductor processing. In some aspects, the plate and shaft device 100 is composed of a ceramic, such as aluminum nitride. The heater has a shaft 101 which in turn supports a plate 102. The plate 102 has a top surface 103. The shaft 101 may be a hollow cylinder. The plate 102 may be a flat disc. Other subcomponents may be present. In some present processes, the plate 102 may be manufactured individually in an initial process involving a process oven wherein the ceramic plate is formed.

Figure 21:
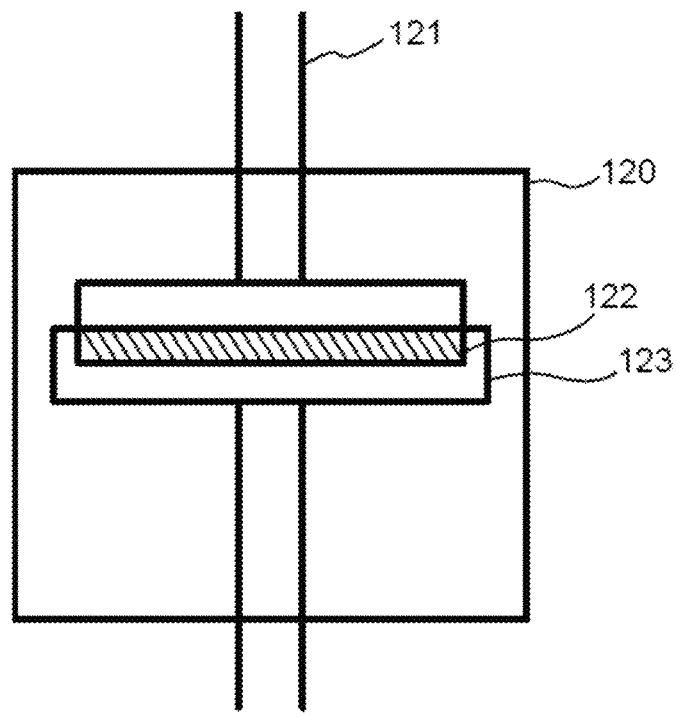
FIG. 21 is a sketch of a high temperature press and oven for a plate according to some embodiments of the present invention.

FIG. 21 conceptually illustrates a process oven 120 with a press 121. The plate 122 may be compressed under temperature in a fixture 123 adapted to be pressed by the press 121. The shaft 101 may also be similarly manufactured in a process step. In a typical process, the plate and shaft are formed by loading of aluminum nitride powder incorporating a sintering aide such as yttria at about 4 weight % into a mold, followed by compaction of the aluminum nitride powder into a "solid" state typically referred to as "green" ceramic, followed by a high-temperature liquid-phase sintering process which densifies the aluminum nitride powder into a solid ceramic body. The high temperature liquid-phase sintering process may see temperatures in the range of 1700 C and contact pressures in the range of 2500 psi. The bodies are then shaped into the required geometry by standard grinding techniques using diamond abrasives.

There are multiple functions of the shaft: one is to provide vacuum-tight electrical communication through the wall of the vacuum chamber in order to apply electrical power to heater elements as well as a variety of other electrode types which may be embedded within the heater plate. Another is to allow temperature monitoring of the heater plate using a monitoring device such as a thermocouple, and allowing that thermocouple to reside outside of the processing chamber in order to avoid interaction such as corrosion between the materials of the thermocouple and the process chemicals, as well as allowing the thermocouple junction to operate in a non-vacuum environment for rapid response. Another function is to provide isolation of the materials used for the previously mentioned electrical communication from the processing environment. Materials used for electrical communication are typically metallic, which could thereby interact with process chemicals used in the processing environment in ways which could be detrimental to the processing results, and detrimental to the lifetime of the metallic materials used for electrical communication.

Figure 22:
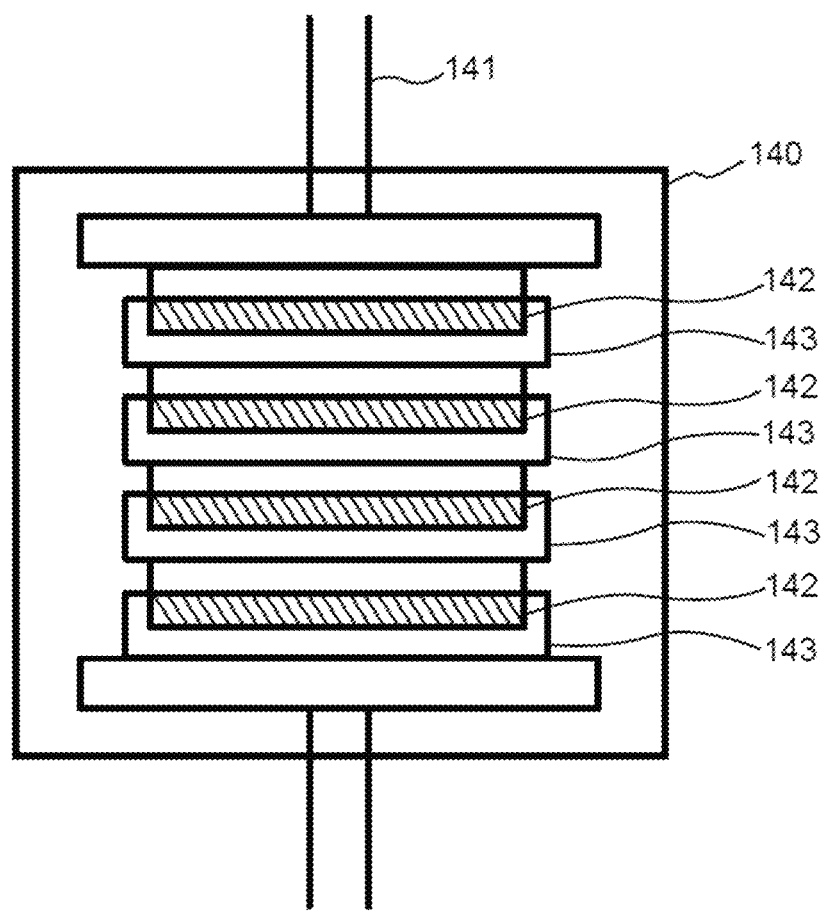
FIG. 22 is a sketch of a high temperature press and oven for a plurality of plates according to some embodiments of the present invention.

Given the relatively flat nature of the plate, a plurality of plates 142 may be formed in a single process by stacking a plurality of plate molding fixtures 143 along the axial direction of the press 141 which resides within the process oven 140, as seen conceptually in FIG. 22. The shafts may also be formed in a similar process using the press in the process oven.

In the overall process of manufacturing a heater used in semiconductor processing both the step of forming plates and forming shafts require significant commitments of time and energy. Given the cost of the specialized high temperature ovens, and that the process steps of forming the plates and forming the shafts each may require the use of a specialized process oven for days, a considerable investment of both time and money has been invested just to get the overall process to the point where the shaft and plate have been completed. Yet a further step in the specialized process oven is required in present processes to affix the plate to the shaft. An example of this step would be to join the shaft to the plate using a liquid phase sintering step in the specialized high temperature process oven with a press. This third step in the specialized process oven also requires significant space in such a process oven as the assembled configuration of the heater includes both the length of the shaft and the diameter of the plate. Although the manufacture of just the shafts may take a similar amount of axial length, the diameter of the shafts is such that multiple shafts may be produced in parallel in a single process.

Figure 23:
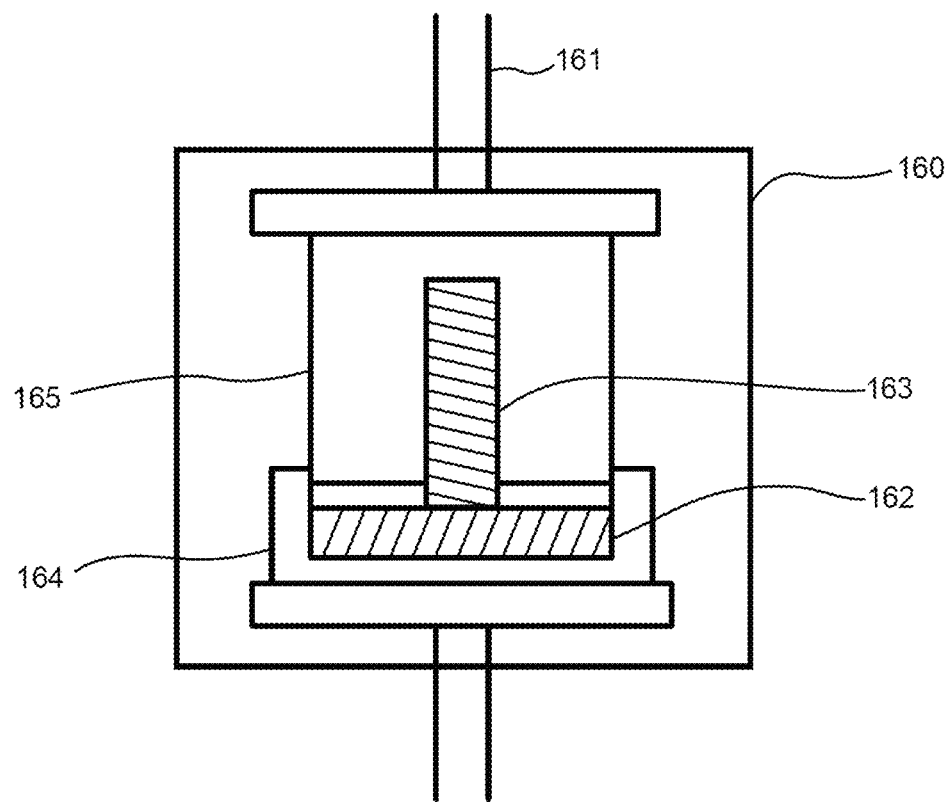
FIG. 23 is a sketch of a high temperature press and oven for a plate and shaft device.

As seen in FIG. 23, the joining process to sinter the shaft to the plate again requires the use of a process oven 160 with a press 161. A set of fixturing 164, 165 is used to position the plate 162 and the shaft 163, and to transmit the pressure delivered by the press 161.

Once the heater is completed, it may be used in semiconductor processing. The heater is likely to be used in harsh conditions, including corrosive gasses, high temperatures, thermal cycling, and gas plasmas. In addition, the heater may be subject to inadvertent impacts. Should the plate or the shaft become damaged, the opportunities for repair of a plate and shaft device joined by liquid phase sintering are limited, perhaps non-existent.

Another prior method for joining ceramic shafts to ceramic plates involves the bolting of the shaft to the plate. Such systems are not hermetic even where the adjoining surfaces are polished to enhance the quality of the seal. A constant positive purge gas pressure is required into the inside of the shaft to reduce process gas infiltration.

An improved method for manufacturing semiconductor processing equipment may involve the joining of a shaft and a plate, which have been described above, into a final joined assembly without the time consuming and expensive step of an additional liquid phase sintering with high temperatures and high contact pressures. The shaft and plate may be joined with a brazing method for joining ceramics.

Figure 24:
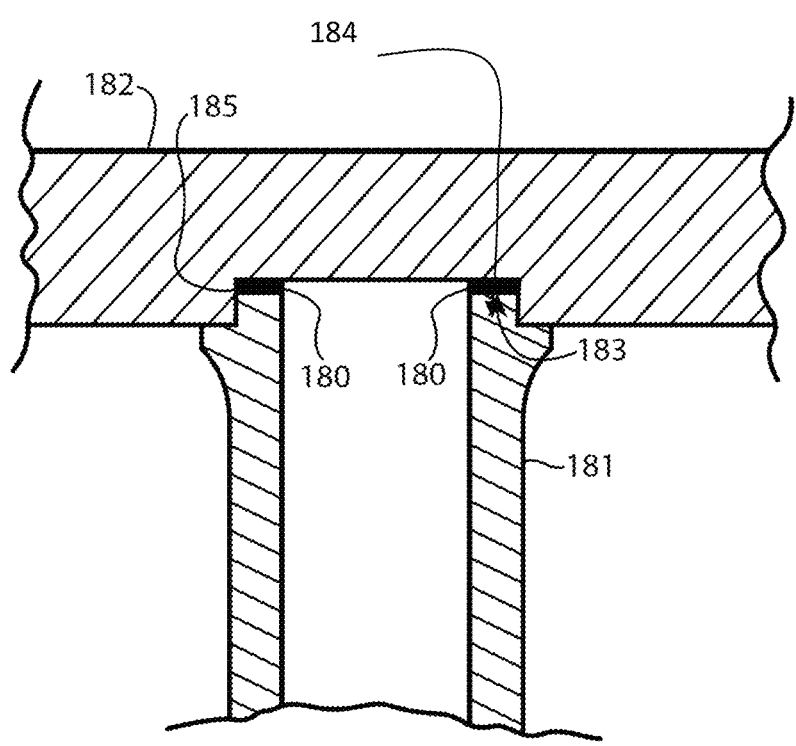
FIG. 24 is a cross-sectional view of a joint between a plate and shaft according to some embodiments of the present invention.

FIG. 24 shows a cross section of an embodiment of a joint in which a first ceramic object, which may be a ceramic shaft 181, for example, may be joined to a second ceramic object, which may be made of the same or a different material, and which may be a ceramic plate 182, for example. A braze filler material 180 may be included, which can be selected from the combinations of braze materials or binders described herein and may be delivered to the joint according to the methods described herein. With respect to the joint depicted in FIG. 24, the shaft 181 is positioned such that it abuts the plate, with only the braze filler interposed between the surfaces to be joined, for example end surface 183 of the end 185 of the shaft 181 and an interface surface 184 of the plate 182. The thickness of the joint is exaggerated for clarity of illustration.

Figure 25:
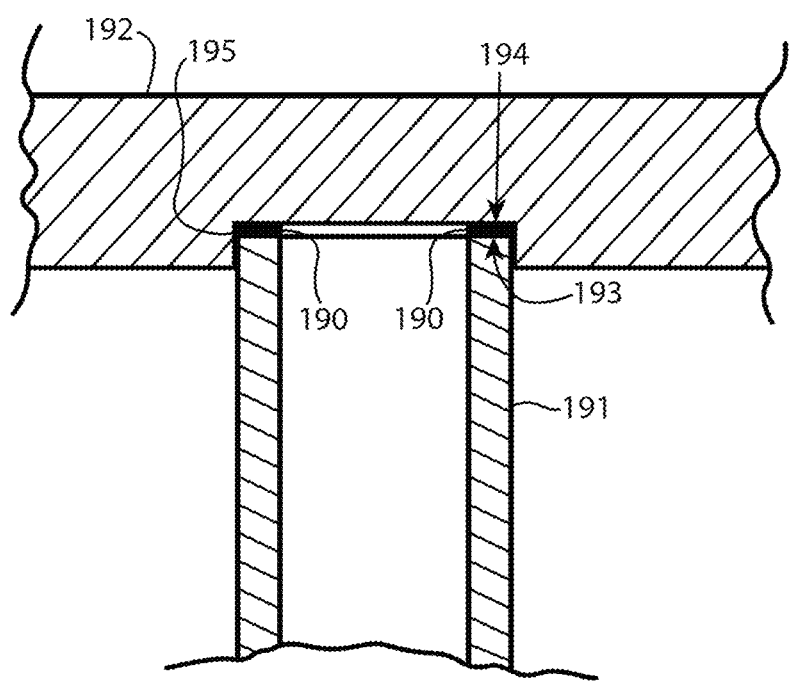
FIG. 25 is a cross-sectional view of a joint between a plate and shaft according to some embodiments of the present invention.

FIG. 25 shows a cross section of a second embodiment of a joint in which a first ceramic object, which may be a ceramic shaft 191, for example, may be joined to a second ceramic object, which may be made of the same or a different material, and which may be a ceramic plate 192, for example. A joining material, such as brazing layer 190, may be included, which can be selected from the combinations of braze layer materials described herein and may be delivered to the joint according to the methods described herein. In some aspects, the plate may be aluminum nitride, or another non-diffusing ceramic, and the shaft may be zirconia, alumina, or another non-diffusing ceramic. In some aspects, it may be desired to use a shaft material with a lower conductive thermal transfer coefficient in some embodiments. In some aspects, it may be desired to use a zirconia shaft with an aluminum nitride plate.

With respect to the joint depicted in FIG. 25, the shaft 191 is positioned such that it abuts the plate, with only the brazing layer interposed between the surfaces to be joined, for example surface 193 of the shaft and surface 194 of the plate. The interface surface 194 of the plate 192 may reside in a recess 195 in the plate. The thickness of the joint is exaggerated for clarity of illustration.

Figure 26:
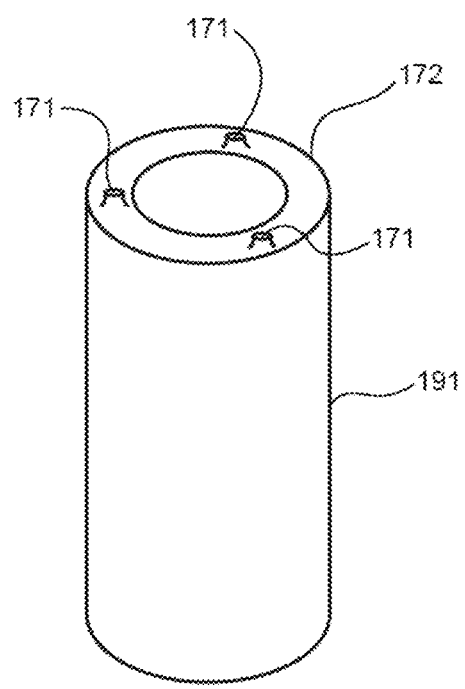
FIG. 26 is a perspective view of a shaft end with mesas according to some embodiments of the present invention.

The embodiments as illustrated in FIGS. 24 and 25 may include a plurality of standoffs adapted to maintain a controlled minimum braze layer thickness. In some embodiments, as seen in FIG. 26, the shaft 191 may utilize a plurality of mesas 171 on the end 172 of the shaft 191 which is to be joined to the plate. The mesas 171 may be part of the same structure as the shaft 191, and may be formed by machining away structure from the shaft, leaving the mesas. In some embodiments, the mesas may be used to create a controlled minimum braze layer thickness of the remainder of the shaft end 172 from the mating surface of the plate. In some embodiments, the braze filler material, prior to brazing, will be thicker than the distance maintained by the mesas between the shaft end and the plate. With appropriate tolerance control on the interface surface of the plate and of the shaft and mesas, the tolerance control of the finished plate and shaft device may be achieved as the mesas move to contact the plate interface during the brazing step. In some embodiments, other methods may be used to establish a minimum braze layer thickness. In some embodiments, ceramic spheres may be used to establish a minimum braze layer thickness.

Figure 27:
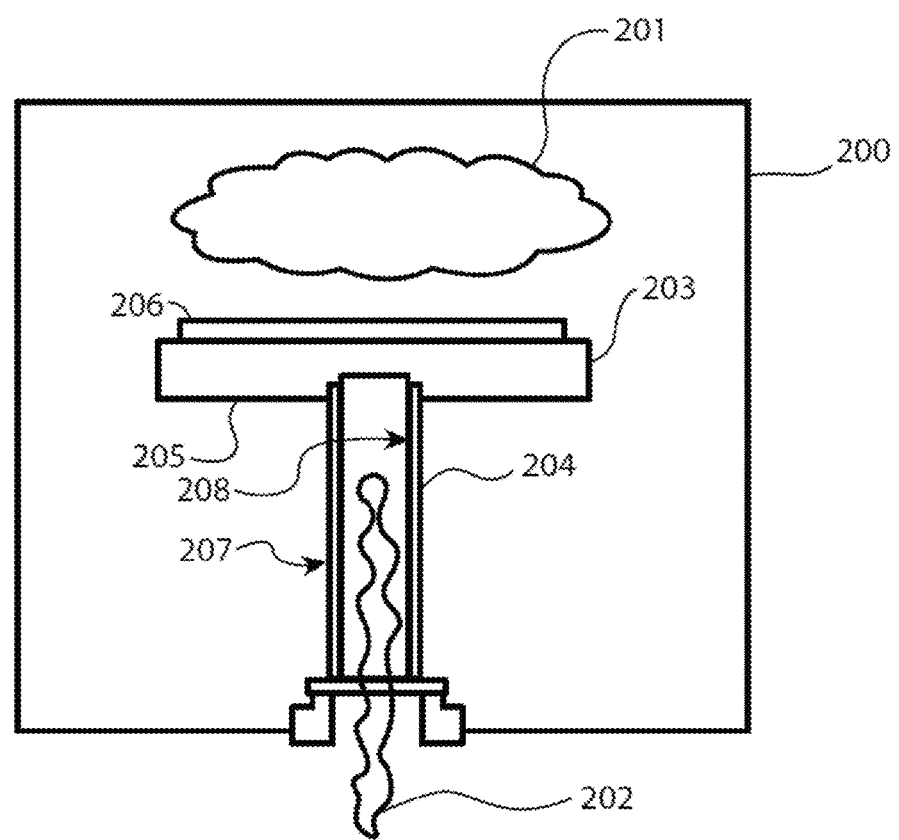
FIG. 27 is a partial cross-sectional view of a plate and shaft device in use in semiconductor manufacturing according to some embodiments of the present invention.

As seen in FIG. 27, the brazing material may bridge between two distinct atmospheres, both of which may present significant problems for prior brazing materials. On an external surface 207 of the semiconductor processing equipment, such as a heater 205, the brazing material must be compatible with the processes occurring in, and the environment 201 present in, the semiconductor processing chamber 200 in which the heater 205 will be used. The heater 205 may have a substrate 206 affixed to a top surface of the plate 203, which is supported by a shaft 204. On an internal surface 208 of the heater 205, the brazing layer material must be compatible with a different atmosphere 202, which may be an oxygenated atmosphere. Prior brazing materials used with ceramics have not been able to meet both of these criteria. For example, braze elements containing copper, silver, or gold may interfere with the lattice structure of the silicon wafer being processed, and are thus not appropriate. However, in the case of a brazed joint joining a heater plate to a heater shaft, the interior of the shaft typically sees a high temperature, and has an oxygenated atmosphere within the center of a the hollow shaft. The portion of the braze joint which would be exposed to this atmosphere will oxidize, and may oxidize into the joint, resulting in a failure of the hermeticity of the joint. In addition to structural attachment, the joint between the shaft and the plate of these devices to be used in semiconductor manufacturing must be hermetic in many, if not most or all, uses.

In an exemplary embodiment, the plate and shaft may both be of aluminum nitride and both have been separately formed previously using a liquid phase sintering process. The plate may be approximately 9-13 inches in diameter and 0.5 to 0.75 inches thick in some embodiments. The shaft may be a hollow cylinder which is 5-10 inches long with a wall thickness of 0.1 inches. The plate may have a recess adapted to receive an outer surface of a first end of the shaft. As seen in FIG. 26, mesas may be present on the end of the shaft which abuts the plate. The mesas may be 0.004 inches high. The plate and shaft may be fixtured together for a joining step with a brazing material of aluminum foil placed between the pieces along the end of the shaft and within the recess of the plate. The brazing material may be 0.006 inches thick prior to brazing with a completed joint minimum thickness of 0.004 inches. The brazing material may be aluminum with 0.4 Wt. % Fe. In some embodiments, the brazing material may be 0.004 inches thick prior to brazing with a completed joint minimum thickness of 0.0035 inches.

Figure 28:
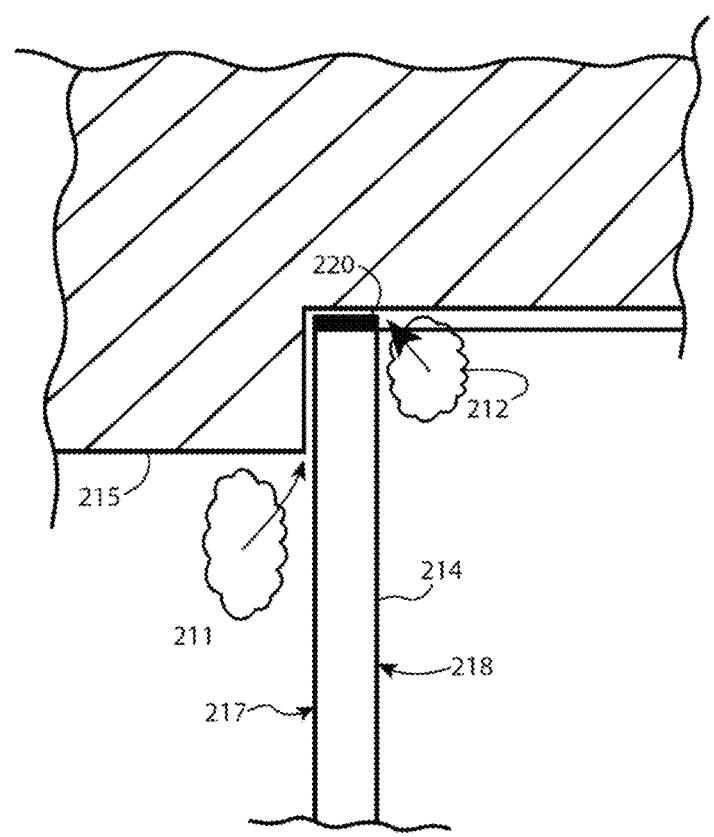
FIG. 28 is a close-up cross-sectional view of a joint between and shaft and a plate according to some embodiments of the present invention.

FIG. 28 illustrates a joint 220 used to join a plate 215 to a shaft 214 according to some embodiments of the present invention. The joint 220 has created a structural and hermetic joint which structurally supports the attachment of the plate 215 to the shaft 214. The joint 220 has created a hermetic seal which isolates the shaft atmosphere 212 seen by the interior surface 218 of the shaft 214 from the chamber atmosphere 211 seen along the exterior surface 217 of the shaft 214 and within the process chamber. The joint 220 may be exposed to both the shaft atmosphere and the chamber atmosphere and must therefore be able withstand such exposure without degradation which may result in the loss of the hermetic seal. In this embodiment, the joint may be aluminum and the plate and the shaft may be ceramic such as aluminum nitride. In some embodiments, the joint 220 may be of aluminum, and which substantially remains in the joint region after the joining process. The residual aluminum may allow for disjoining of the joint for repair, rework, or other reasons.

Figure 29:
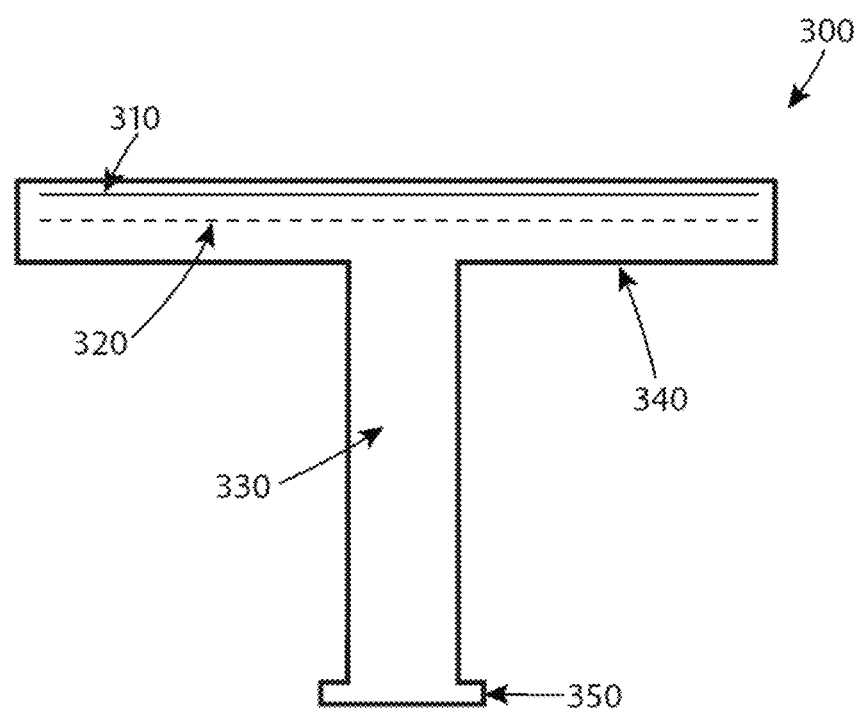
FIG. 29 is view of a plate and shaft device according to some embodiments of the present invention.

FIG. 29 shows one embodiment of a schematic illustration of a heater column used in a semiconductor processing chamber. The heater 300, which may be a ceramic heater, can include a radio frequency antenna 310, a heater element 320, a shaft 330, a plate 340, and a mounting flange 350. One embodiment of a brazing method for joining together a shaft 330 and a plate 340, both or either one of which may be made of aluminum nitride, to form the heater 300 may be implemented as follows.

A sheet of aluminum or aluminum alloy may be provided between the shaft and the plate, and the shaft and the plate may be brought together with the sheet of the brazing layer disposed therebetween. The brazing layer may then be heated in a vacuum to a temperature of at least 800 C and cooled to a temperature below 600 C so that the brazing layer hardens and creates a hermetic seal joining the shaft to the plate. The shaft of said heater may be of solid material or it may be hollow in conformation. In some aspects, the brazing temperature is at least 770 C. In some aspects, the brazing temperature is in the range of 770 C to 1200 C.

The fixturing may put a contact pressure of approximately 2-200 psi onto the joint contact area. In some embodiments the contact pressure may be in the range of 2-40 psi. The contact pressure used at this step is significantly lower than that seen in the joining step using hot pressing/sintering as seen in prior processes, which may use pressures in the range of 2000-3000 psi. With the much lower contact pressures of the present methods, the specialized presses of the previous methods are not needed. The pressures needed for the joining of the plate to the shaft using the present methods may be able to be provided using simple fixturing, which may include a mass placed onto the fixturing using gravity to provide the contact pressure. In some embodiments, contact between the interface portion of the shaft and the brazing element, as well as contact between the interface portion of the plate and the brazing element, will provide contact pressure sufficient for joining Thus, the fixture assembly need not be acted upon by a press separate from the fixture assembly itself. The fixtured assembly may then be placed in a process oven. The oven may be evacuated to a pressure of 1×10E-5 Torr. In some aspects, vacuum is applied to remove residual oxygen. In some embodiments, a vacuum of lower than 1×10E-4 Torr is used. In some embodiments, a vacuum of lower than 1×10E-5 Torr is used. Of note with regard to this step is that the high temperature oven with high contact pressure fixturing, which was required during the manufacture of the ceramic components (shaft and plate), is not needed for this joining of the shaft and plate. When a minimum joint thickness is maintained, such as with the use of standoffs, the contact pressure across the joint need only be sufficient to allow the standoffs to meet the interface area of the adjacent ceramic. There may be a very thin layer of braze material between the standoff and the adjacent interface area, as the liquid braze material may not be fully cleared between the standoff and the adjacent interface area.

In some embodiments, the plate and shaft may comprise different ceramics. The plate may be adapted to provide a high conductive heat coefficient, whereas the shaft may be adapted to provide a lower conductive heat coefficient such that heat is not lost down the shaft towards the mounting appurtenances of the process chamber. For example, the plate may be made of aluminum nitride and the shaft may be made of zirconia.

Figure 30:
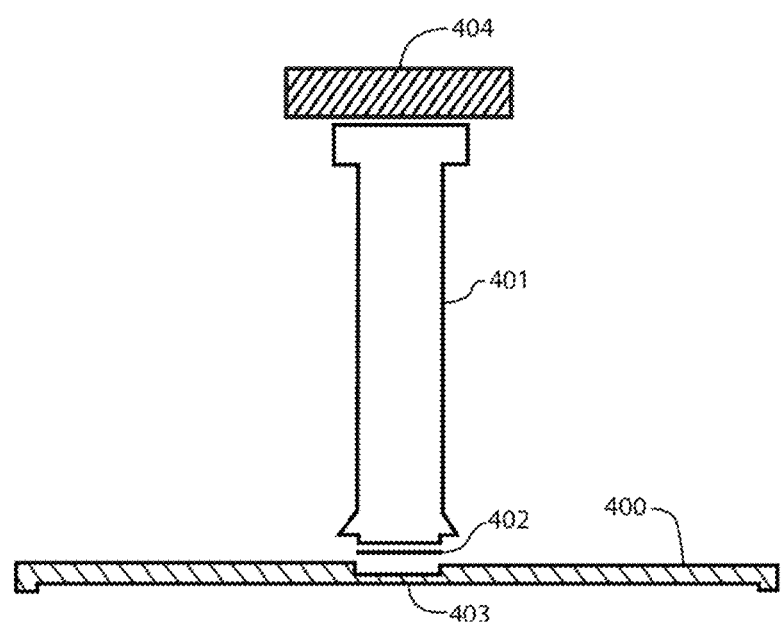
FIG. 30 is an illustration of plate and shaft ready for assembly according to some embodiments of the present invention.
Figure 31:
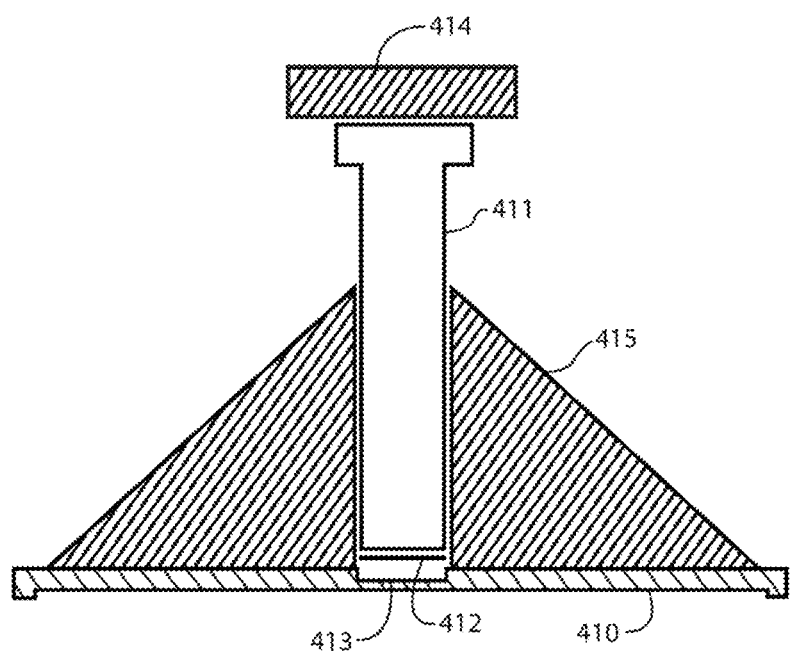
FIG. 31 is an illustration of plate and shaft with fixturing ready for assembly according to some embodiments of the present invention.
Figure 32:
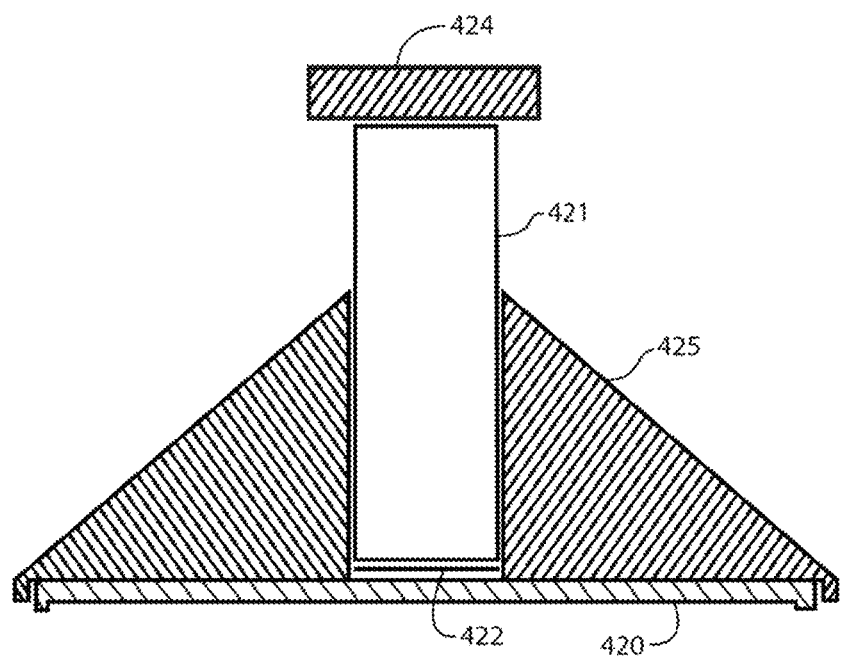
FIG. 32 is an illustration of plate and shaft with fixturing ready for assembly according to some embodiments of the present invention.

FIGS. 30-32 illustrate a joining process which may join a shaft to a plate according to some embodiments of the present invention. The joining process may be run in a process oven with lower temperatures, contact pressures, and lower time and cost commitments than in previous joining operations.

In some embodiments, as seen in FIG. 30, alignment and location of the shaft and plate is maintained by part geometries, eliminating fixturing and post-bond machining Weighting may be used to insure there is no movement during bonding process, other than some axial movement as the braze material melts. The plate 400 may be placed top down with a joining element 402 within a recess 403 in the back surface of the plate 400. The shaft 401 may be inserted vertically downward into the recess 403 within the plate 400.

A weight 404 may be placed on the shaft 401 to provide some contact pressure during the joining process.

In some embodiments, as seen in FIG. 31, location of the shaft and plate is maintained by part geometries, reducing post-bond machining Fixturing may be required to maintain a perpendicularity between shaft and plate during bond processing. In some embodiments, the tolerance control of the mesas and the interface portion of the plate may be used to control the dimensions and tolerances of the final assembly. Weighting may also be used to insure there is no movement during bonding process, other than some axial movement as the braze material melts. The plate 410 may be placed top down with a joining element 412 within a recess 413 in the back surface of the plate 410. The shaft 411 may be inserted vertically downward into the recess 413 within the plate 410. A fixture 415 is adapted to support and locate the shaft 411. A weight 414 may be placed on the shaft 411 to provide some contact pressure during the joining process. In some embodiments, a weight is not used. In some embodiments, the mass of the items to be joined may provide force, with gravity, to apply pressure between the items to be joined.

In some embodiments, as seen in FIG. 32, location and perpendicularity of shaft/plate is maintained by fixturing. Fixturing may not be precise due to thermal expansion and machining tolerances—therefore, post-bond machining may be required. The shaft diameter may be increased to accommodate required material removal to meet final dimensional requirements. Again, weighting may be used to insure there is no movement during bonding process, other than some axial movement as the braze material melts. The plate 420 may be placed top down with a joining element 422 above the back surface of the plate 420. The shaft 421 may be placed onto the plate 420 to create a plate and shaft pre-assembly. A fixture 425 is adapted to support and locate the shaft 421. The fixture 425 may be keyed to the plate to provide positional integrity. A weight 424 may be placed on the shaft 411 to provide some contact pressure during the joining process.

Upon initiating the heating cycle, the temperature may be raised slowly, for example 15C per minute to 200 C and then 20 C per minute thereafter, to standardized temperatures, for example, 600 C and the joining temperature, and held at each temperature for a fixed dwell time to allow the vacuum to recover after heating, in order to minimize gradients and/or for other reasons. When the braze temperature has been reached, the temperature can be held for a time to effect the braze reaction. In an exemplary embodiment, the dwell temperature may be 800 C and the dwell time may be 2 hours. In another exemplary embodiment, the dwell temperature may be 1000 C and the dwell time may be 15 minutes. In another exemplary embodiment, the dwell temperature may be 1150 and the dwell time may be 30-45 minutes. In some embodiments, the dwell temperature does not exceed a maximum of 1200 C. In some embodiments, the dwell temperature does not exceed a maximum of 1300 C. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation.

An aspect of the current invention is the maximum operating temperature of the bonded shaft-plate as defined by the decreasing tensile strength, with temperature, of the aluminum or aluminum alloy selected for the joining. For example, if pure aluminum is employed as the joining material, the structural strength of the bond between the shaft and plate becomes quite low as the temperature of the joint approaches the melting temperature of the aluminum, generally considered to be 660 C. In practice, when using 99.5% or purer aluminum, the shaft-plate assembly will withstand all normal and expected stresses encountered in a typical wafer processing tool to a temperature of 600 C. However, some semiconductor device fabrication processes require temperatures greater than 600 C.

Figure 33:
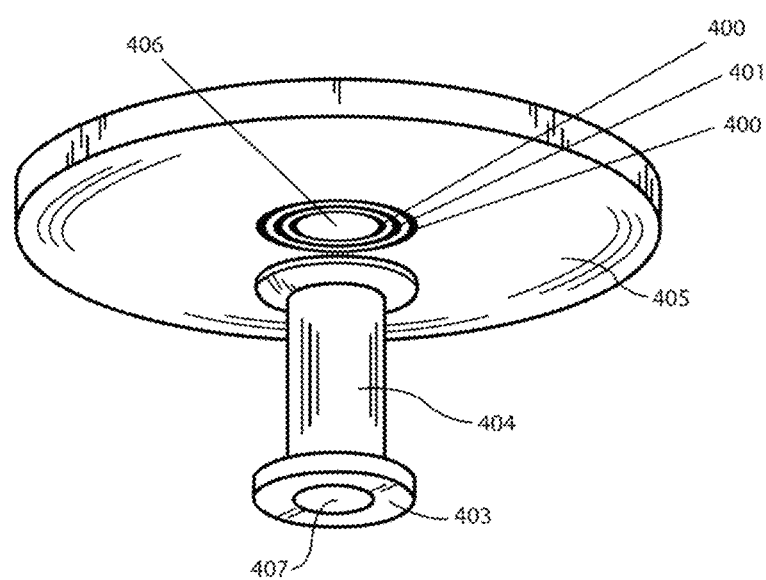
FIG. 33 is an exploded view of a plate and shaft assembly with multiple concentric joining layers according to some embodiments of the present invention.

A further embodiment of the present invention is seen in FIG. 33. As has been disclosed, aluminum or aluminum alloy material, 400, may be used to join the shaft 404 to the plate 405 in a hermetic fashion. Further, another joining material 401 that has both the ability to bond with AlN and a higher melting temperature than aluminum, that is, greater than 660 C, may be used as a structural bond to extend the usable temperature of the shaft-plate assembly to higher temperatures. For example, a titanium-nickel alloy has been demonstrated to bond to aluminum nitride at a temperature within the bonding temperature range used for aluminum as previously described. Other titanium and zirconium alloys may be used as well, many of them containing silver, copper, or gold as alloying elements. Because of their higher melting temperatures, the use of these alloys extends the usable temperature range of the shaft-plate assembly to 700 C or 800 C or 900 C. However, as previously discussed, the elements silver, copper, and gold may be detrimental to the crystalline structure of wafers and must be isolated from the process environment with extreme care. In a similar fashion, titanium and zirconium are easily and detrimentally oxidized when exposed to air at temperatures typically used in wafer process. A solution is to use aluminum "guard bands" around the structural joining material, one band disposed to the process side if necessary to prevent the migration of detrimental elements to the wafer, and one band disposed to the atmosphere side to prevent oxidation of the titanium or zirconium structural bond. In some embodiments, there may be a guard band on only the inner or only the outer side of the joint of other material. In some embodiments, the concentric joints may be at different elevations, in that the end of the shaft has a plurality of plateaus wherein the joints are placed.

As seen in FIG. 33, a flange 403 is hermetically sealed, usually with an elastomeric O-ring, to the process chamber base (not shown). Electrical connections for heating, or electrostatic chucking, or RF conduction, or temperature monitoring, are routed through the shaft center 407 and connect to the plate in the central area 406. Typically the electrical connections and shaft center are in an ambient (air) environment.

After the step of joining the plate to the shaft, the shaft and/or the plate may undergo further machining in the completion of the finished piece. The pressures required to achieve the liquid-phase sintering necessary for typical previous plate-shaft joining required mechanical strengths higher than those provided by typical finish dimensions of heater shafts, as the components needed to withstand the high forces associated with the high pressures of the previous joining process. Therefore, to reduce cracking failures during the bonding process, thicker ceramic sections may have been used for the shaft than are needed in the final configuration. Final required dimensions are then achieved by grinding the bonded plate/shaft assembly after bonding. Although the plate and shaft assemblies of the present invention may undergo some further machining after joining in some embodiments, in other embodiments this is not required. The elimination of the need to utilize thick shafts to withstand forces of high contact pressure joining of shafts and plates, as was required is past methods, removes another time consuming and costly process step from the manufacture of plate and shaft assemblies in processes according to embodiments of the present invention.

Another advantage of the joining method as described herein is that joints made according to some embodiments of the present invention may allow for the disassembly of components, such as the shaft and the plate, if desired, to repair or replace one of those two components. For example, should a plate become damaged due to arc discharge, the plate may be removed from the assembly and replaced. This will allow the cost savings associated with the re-use of a shaft, for example. Also, with an inventory of shafts and plates on hand, a replacement heater may be assembled without need for a high temperature, high pressure process, as the replacement component and the previously used component may be joined according to embodiments of the present invention. Similarly, should the joint, which is both structural and hermetic, lose its hermeticity, the joint may be repaired.

A repair procedure for the unjoining of an assembly which has been joined according to embodiments of the present invention may proceed as follows. The assembly may be placed in a process oven using a fixture adapted to provide a tensile force across the joint. The fixturing may put a tensile stress of approximately 2-30 psi onto the joint contact area. The fixturing may put a larger stress across the joint in some embodiments. The fixtured assembly may then be placed in a process oven. The oven may be evacuated, although it may not be required during these steps. The temperature may be raised slowly, for example 15C per minute to 200 C and then 20 C per minute thereafter, to standardized temperatures, for example 400 C, and then to a disjoining temperature. Upon reaching the disjoining temperature, the pieces may come apart from each other. The disjoining temperature may be specific to the material used in the brazing layer. The disjoining temperature may be in the range of 600-800 C in some embodiments. The disjoining temperature may be in the range of 800-1000 C in some embodiments. The fixturing may be adapted to allow for a limited amount of motion between the two pieces such that pieces are not damaged upon separation. The disjoining temperature may be material specific. The disjoining temperature may be in the range of 450 C to 660 C for aluminum.

Prior to the re-use of a previously used piece, such as a ceramic shaft, the piece may be prepared for re-use by machining the joint area such that irregular surfaces are removed. In some embodiments, it may be desired that all of the residual brazing material be removed such that the total amount of brazing material in the joint is controlled when the piece is joined to a new mating part.

In contrast to joining methods which create diffusion layers within the ceramic, joining processes according to some embodiments of the present invention do not result in such a diffusion layer. Thus, the ceramic and the brazing material retain the same material properties after the brazing step that they had prior to the brazing step. Thus, should a piece be desired to be re-used after disjoining, the same material and the same material properties will be present in the piece, allowing for re-use with known composition and properties.

Figure 34:
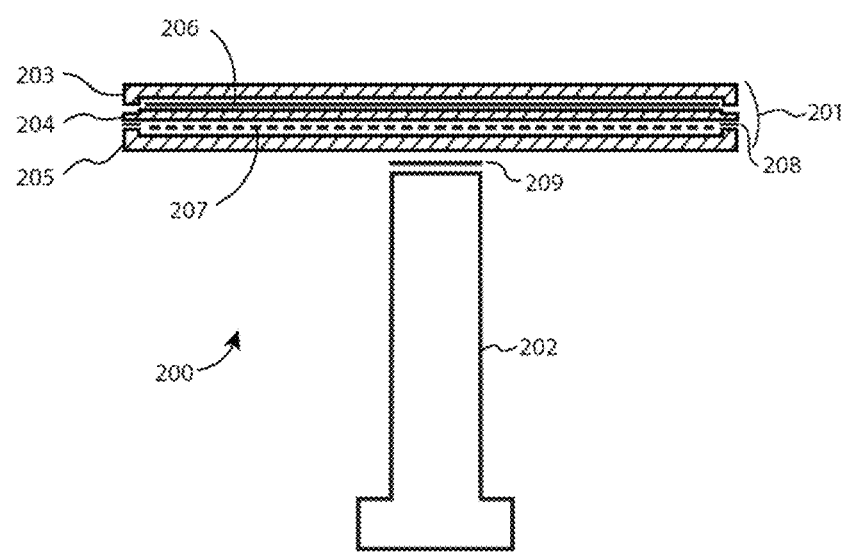
FIG. 34 is a partial cross-sectional view of a heater with a multi-layer plate according to some embodiments of the present invention.

In some embodiments of the present invention, as seen in expanded view in FIG. 34, a plate and shaft device 200 is seen with a plate assembly 201 and a shaft 202. The plate assembly 201 has layers 203, 204, 205 which are fully fired ceramic layers prior to their assembly into the plate assembly 201. The top plate layer 203 overlays the middle layer 204 with an electrode layer 206 residing between the top plate layer 203 and the middle layer 204. The middle layer 204 overlays the bottom layer 205 with a heater layer 207 residing between the middle layer 204 and the bottom layer 205.

The layers 203, 204, 205 of the plate assembly 201 may be of a non-diffusing ceramic such as aluminum nitride in the case of a heater, or other materials including alumina, doped alumina, AlN, doped AlN, beryllia, doped beryllia and others in the case of an electrostatic chuck. The layers 203, 204, 205 of the plate assembly that makes up the substrate support may have been fully fired ceramic prior to their introduction into the plate assembly 201. For example, the layers 203, 204, 205 may have been fully fired as plates in a high temperature high contact pressure specialty oven, or tape cast, or spark-plasma sintered, or other method, and then machined to final dimension as required by their use and their position in the stack of the plate assembly. The plate layers 203, 204, 205 may then be joined together using a brazing process with joining layers 208 which allow the final assembly of the plate assembly 201 to be done without the need for a specialty high temperature oven equipped with a press for high contact stresses.

In embodiments wherein a shaft is also part of the final assembly, such as in the case of a plate and shaft device, the plate assembly 201 to shaft 202 joining process step may also use a brazing process done without the need for a specialty high temperature oven equipped with a press for high contact stresses. The joining of the plate layers, and the plate assembly to the shaft, may be done in a simultaneous process step in some embodiments. The shaft 202 may be joined to the plate assembly 201 with a joining layer 209. The joining layer 209 may be a brazing element which is identical to the joining layers 208 in some embodiments.

An improved method for manufacturing a plate, or plate assembly, may involve the joining of layers of the plate assembly, which have been described above and are described in more detail below, into a final plate assembly without the time consuming and expensive step of an additional processing with high temperatures and high contact pressures. The plate layers may be joined with a brazing method for joining ceramics according to embodiments of the present invention. An example of a brazing method for joining together first and second ceramic objects may include the steps of bringing the first and second objects together with a brazing layer selected from the group consisting of aluminum and an aluminum alloy disposed between the first and second ceramic objects, heating the brazing layer to a temperature of at least 800 C, and cooling the brazing layer to a temperature below its melting point so that the brazing layer hardens and creates a hermetic seal so as to join the first member to the second member. In some aspects, the brazing temperature is at least 770 C. In some aspects, the brazing temperature is in the range of 770 C to 1200 C. Various geometries of braze joints may be implemented according to methods described herein.

In some embodiments of the present invention a plate assembly with layers may be presented such that standoffs are present between the layers of the plate such that when the joining layer is heated, and slight pressure is applied axially to the plates, there is slight axial compression such that the joining layer is mildly thinned until the standoff on one plate contacts the adjacent plate. In some aspects, this allows for not just control of the joint thickness but also for dimensional and tolerance control of the plate assembly. For example, the parallelism of features of the various plates can be set by machine tolerances on the plate layers, and this aspect can be maintained during the joining process with the use of standoffs. In some embodiments, post-joining dimensional control may be achieved using a circumferential outer ring on one plate layer which overlays an inner ring on an adjacent layer to provide axial conformance. In some embodiments, one of the outer ring or the inner ring may also contact the adjacent plate in an axial direction perpendicular to the plate such that positional control is also achieved in that axial direction. The axial positional control may also thus determine the final thickness of a joining layer between the two adjacent plates.

In some embodiments of the present invention an electrode between layers may be of the same material as the joining layer, and may function in a dual capacity of both the joining layer and the electrode. For example, the area previously occupied by an electrode in an electrostatic chuck may instead be occupied by a joining layer which has the dual function of performing as an electrode, for providing electrostatic clamping force for example, and of performing as a joining layer to join the two plates between which the joining layer resides. In such embodiments, a labyrinth may be around the periphery of the two joined plate such that line of sight, and access in general, to the charged electrode from a region outside of the plate is minimized.

Figure 35:
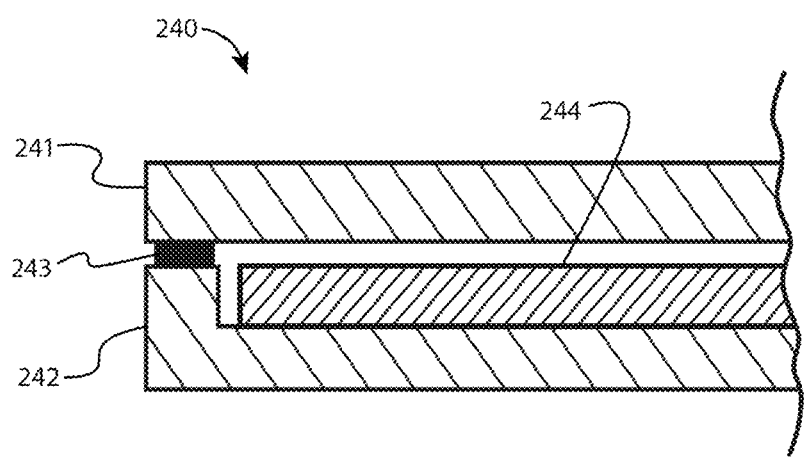
FIG. 35 is a partial cross-sectional view of a multi-layer plate according to some embodiments of the present invention.

FIG. 35 illustrates a partial cross-section of a plate assembly 240 according to some embodiments of the present invention. The plate assembly 240 may be adapted to be joined to a shaft to complete a plate and shaft assembly. The top plate layer 241 may be a circular disc adapted to support a substrate during semiconductor processing steps. A heater 244 is adapted to reside below the top plate layer 241. The heater may be attached or adhered to one or both of the plate layers. The top plate layer 241 overlays the bottom plate layer 242. A joining layer 243 joins the top plate layer 241 to the bottom plate 242. The joining layer may be an annular disc. In some embodiments, the top plate layer and the bottom plate layer are ceramic. In some embodiments, the top plate layer and the bottom plate layer are aluminum nitride. The top plate layer and the bottom plate layer may be a non-diffusing ceramic from the group which includes aluminum nitride, alumina, zirconia, and beryllium oxide. In some embodiments the joining layer is aluminum. Examples of the joining process and materials are discussed below.

Figure 36:
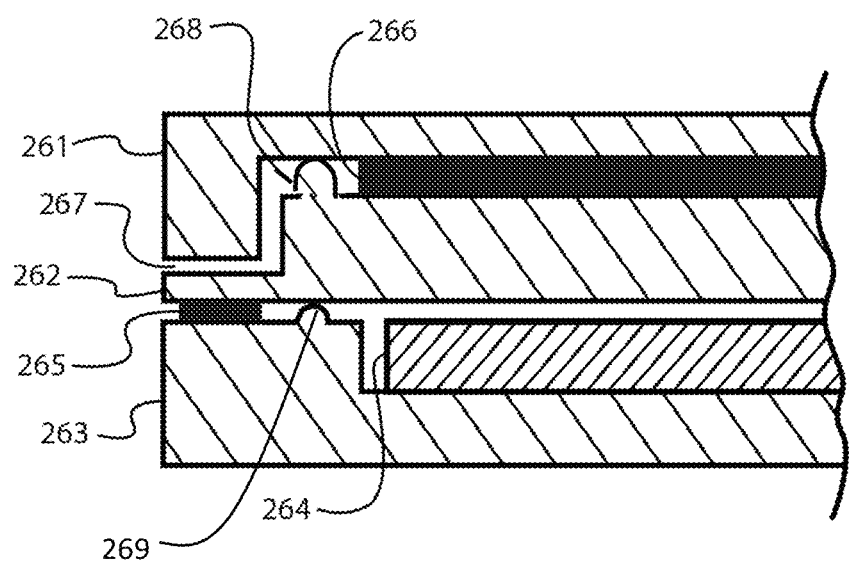
FIG. 36 is a partial cross-sectional view of a multi-layer plate according to some embodiments of the present invention.

FIG. 36 illustrates a partial cross-section of a plate assembly 260 according to some embodiments of the present invention. The plate assembly 260 is a multi-layer plate assembly with both a heater and an electrode residing between different layers. The layers are joined with brazing elements and the final position of the plates in a direction perpendicular to the plane of the primary plane of the plates is dictated by standoffs 268 on the plates.

Figure 41:
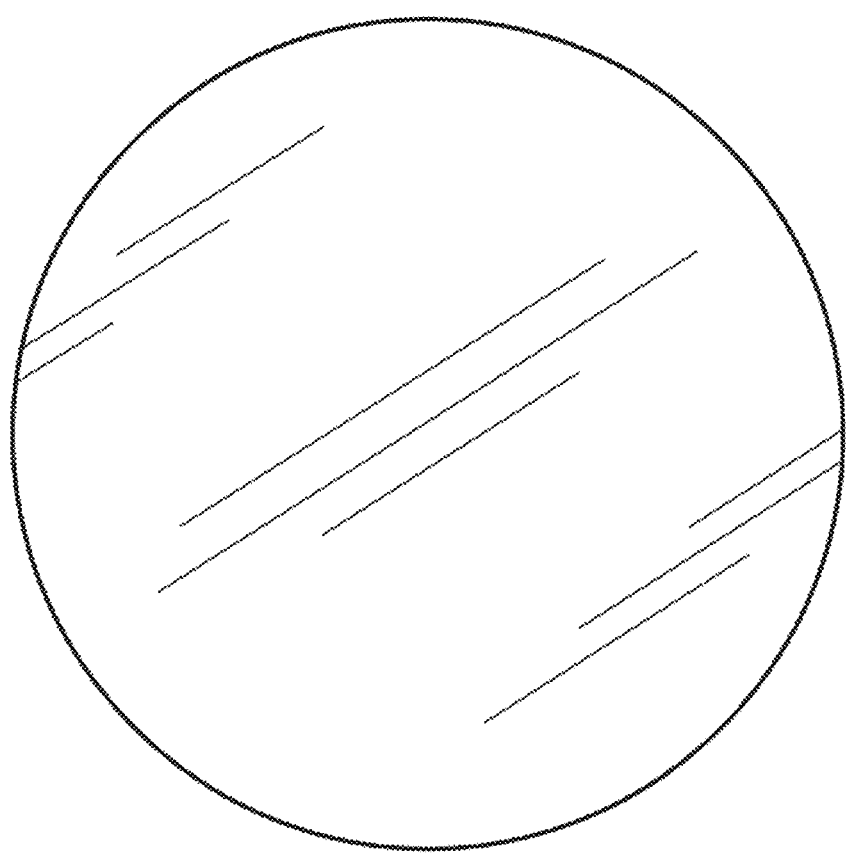
FIG. 41 is an illustration of an RF shield according to some embodiments of the present invention.

A top plate layer 261 overlays a lower plate layer 262. The lower plate layer 262 overlays a bottom plate layer 263. Although illustrated in FIG. 36 with three plate layers, different numbers of plate layers may be used according to the needs of a particular application. The top plate layer 261 is joined to the lower plate layer 262 using a multi-function joining layer 266. The multi-function joining layer 266 is adapted to provide joining of the top plate layer 261 to the lower plate layer 262 and to be an electrode. FIG. 41 illustrates an embodiment of such an electrode. Such an electrode may be a joining layer that is substantially a circular disc, wherein the joining material also functions as an electrode. As seen in FIG. 36, a standoff 268 is adapted to provide positional control of the top plate layer 261 to the lower plate layer 262 in a vertical direction perpendicular to the primary plane of the plate layers. The rim of the top plate layer 261 is adapted to remove line of sight along the boundary 267 between the two plates at their periphery. The thickness of the joining layer 266 may be sized such that the joining layer 266 is in contact with the top plate layer 261 and the lower plate layer 262 prior to the step of heating and joining the plate assembly.

The lower plate layer 262 overlays the bottom plate layer 263. A heater 264 resides between the lower plate layer 262 and the bottom plate layer 263. A joining layer 265 joins the lower plate layer 262 to the bottom plate layer 263. The joining layer 265 may be an annular ring within the periphery of the plate layers. A standoff 269 is adapted to provide positional control of the lower plate layer 262 to the bottom plate layer 263 in a vertical direction perpendicular to the primary plane of the plate layers. During a joining step of the plate assembly, the components as seen in FIG. 36 may be preassembled, and then this plate pre-assembly may be joined using processes described herein to form a completed plate assembly. In some embodiments, this plate pre-assembly may be further preassembled with a shaft and shaft joining layer such that a complete plate and shaft device may be joined in a single heating process. This single heating process may not require a high temperature oven, or a high temperature oven with presses adapted to provide high contact stresses. In addition, in some embodiments the completed plate and shaft assembly may not require any post-joining machining yet may still meet the tolerance requirements of such a device in actual use in semiconductor manufacturing.

Figure 37:
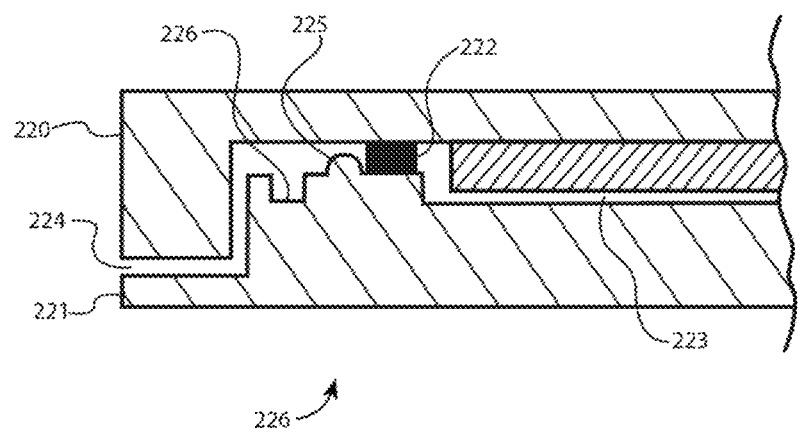
FIG. 37 is a partial cross-sectional view of a multi-layer plate according to some embodiments of the present invention.

FIG. 37 illustrates a partial cross-sectional view of two plate layers 220, 221 wherein a reservoir 226 is seen in the bottom plate layer 221. A top plate layer 220 may overlay a bottom plate layer 221. An electrode portion 223 may be present in between the top plate layer 220 and the bottom plate layer 221. A standoff 225 is adapted to provide positional control of the top plate layer 220 to the bottom plate layer 263 in a vertical direction perpendicular to the primary plane of the plate layers. A reservoir 226 may reside in the bottom plate layer radially outside of the joining layer 222. The reservoir 226 is positioned such that possible excess joining material from the joining layer may be captured in the reservoir, and not move into the labyrinth 224. In the case of a plate wherein the electrode and the joining layer are the same feature, as seen in the electrode 266 of FIG. 6, the reservoir may be more important as the joining layer, and its possible excess, may be electrically charged and thus not appropriate to seep towards outer periphery of the plate assembly.

In some embodiments, a plate layer may include channels adapted for the routing of gasses through the substrate assembly. A plate layer may have channels, wherein the material of the plate layer between the channels is joined to the adjacent plate according to methods of the present invention. Thus, an individual plate layer could be manufactured such that the channels are present in the final fully fired ceramic piece, and this piece may be joined to the adjacent layer. The channels may be coupled to the shaft and/or conduits within the shaft in some embodiments.

One embodiment of a brazing method for joining together plate layers, which may be made of aluminum nitride, to form the plate assembly, may be implemented as follows. A sheet of aluminum or aluminum alloy metal binder or filler may be provided between the plate layers, and also the shaft and the bottom plate layer in some aspects, and the plate layers may be brought together with the sheet of the metal binder disposed therebetween. The metal binder or filler may then be heated in a vacuum to a temperature of at least 800 C and cooled to a temperature below 600 C so that the metal binder or filler hardens and creates a hermetic seal joining the plate layers to each other into a plate assembly, and joining the shaft to the plate assembly. In some aspects, the braze layer may be heated in a vacuum to a temperature of at least 770 C. In some aspects, the braze layer may be heated to a temperature in the range of 770 C to 1200 C.

In an exemplary embodiment, the plate layers may be of aluminum nitride and have been separately formed previously using a liquid phase sintering process. The plate layers may be approximately 200 mm to 300 mm in diameter and 0.1 to 0.75 inches thick in some embodiments. The shaft may be a hollow cylinder which is 5-10 inches long with a wall thickness of 0.1 inches. The bottom of the plate assembly may have a recess adapted to receive an outer surface of a first end of the shaft. The plate assembly and shaft may be fixtured together for a joining step with a brazing material of aluminum foil placed between the pieces at the appropriate pre-determined joining locations. The fixturing may put a contact pressure of approximately 2-200 psi onto the joint contact areas. In some embodiments the contact pressure may be in the range of 2-40 psi. The contact pressure used at this step is significantly lower than that seen in the joining step using hot pressing/sintering as seen in prior processes, which may use pressures in the range of 2000-3000 psi. With the much lower contact pressures of the present methods, the specialized presses of the previous methods are not needed. The pressures needed for the joining of the plate layers to each other into a plate assembly, and of the plate assembly to the shaft using the present methods may be able to be provided using simple fixturing, which may include a mass placed onto the fixturing using gravity to provide the contact pressure. In some embodiments, contact between the interface portions of the plate layers, and of the shaft and the brazing element, as well as contact between the interface portion of the plates and the brazing element, will provide contact pressure sufficient for joining Thus, the fixture assembly need not be acted upon by a press separate from the fixture assembly itself. The fixtured assembly may then be placed in a process oven. The oven may be evacuated to a pressure of 1×10E-5 Torr. In some aspects, vacuum is applied to remove residual oxygen. In some embodiments, a vacuum of more than 1×10E-4 Torr is used. In some embodiments, a vacuum of more than 1×10E-5 Torr is used. Of note with regard to this step is that the high temperature oven with high contact pressure fixturing, which was required during the manufacture of the ceramic components (shaft and plate), is not needed for this joining step. Upon initiating the heating cycle, the temperature may be raised slowly, for example 15C per minute to 200 C and then 20 C per minute thereafter, to standardized temperatures, for example, 600 C and the joining temperature, and held at each temperature for a fixed dwell time to allow the vacuum to recover after heating, in order to minimize gradients and/or for other reasons. When the braze temperature has been reached, the temperature can be held for a time to effect the braze reaction. In an exemplary embodiment, the dwell temperature may be 800 C and the dwell time may be 2 hours. In another exemplary embodiment, the dwell temperature may be 1100 C and the dwell time may be 15 minutes. In another exemplary embodiment, the dwell temperature may be 1075 C and the dwell time may be 1 hours. In some embodiments, the dwell temperature does not exceed a maximum of 1100 C. In some embodiments, the dwell temperature does not exceed a maximum of 1300 C. In some embodiments, the dwell temperature does not exceed a maximum of 1400 C. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation.

Figure 38:
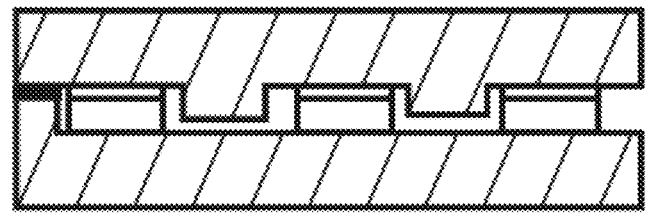
FIG. 38 is a partial cross-sectional view of a multi-layer plate according to some embodiments of the present invention.
Figure 39:
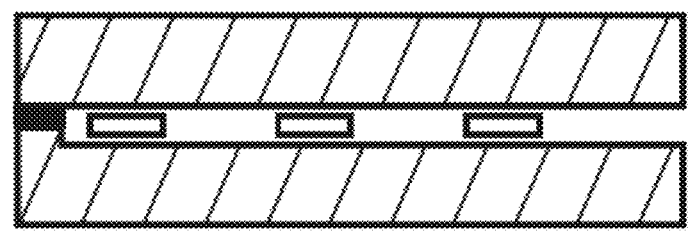
FIG. 39 is a partial cross-sectional view of a multi-layer plate according to some embodiments of the present invention.
Figure 40:
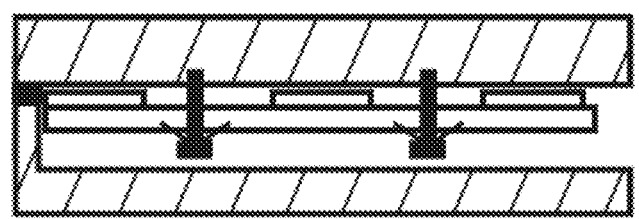
FIG. 40 is a partial cross-sectional view of a multi-layer plate according to some embodiments of the present invention.

FIGS. 38-40 illustrates embodiments of heater elements between plate layers in a substrate support assembly according to some embodiments of the present invention.

In some embodiments, the plate may be circular. In some embodiments, the plate may be square. In some embodiments, the plate may be a different shape.

In some embodiments of a multi-layer plate device, for example a device without a shaft, layers of ceramic may overlay a base of metal, or other material. In such embodiments, joining of the layers to each other, and to the base, may be performed using processes as described herein. In some embodiments, layers of other material may be interspersed between other ceramic layers.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

The invention claimed is:

1. A method for the joining of ceramic materials, said method comprising the steps of:
    placing an aluminum brazing element between an interface area of a first ceramic piece and an interface area of a second ceramic piece to create a joining pre-assembly, wherein said second ceramic comprises beryllium oxide, wherein said aluminum has not diffused into said second ceramic piece, and wherein said aluminum brazing element comprises 99% by weight or greater aluminum;
    placing the components of said joining pre-assembly into a process chamber;
    removing oxygen from said process chamber;
    heating at least said aluminum brazing element of said joining pre-assembly to a first joining temperature of between 770 C and 1200 C, thereby joining said first ceramic piece to said second ceramic piece with a hermetically sealed aluminum joint wherein said aluminum has not diffused into said second ceramic piece, and wherein the thickness of said final joint is greater than zero.

2. The method of claim 1 wherein the step of removing oxygen from said process chamber comprises applying a pressure of lower than 1×10E-4 Torr to said process chamber.

3. The method of claim 1 wherein the step of removing oxygen from said process chamber comprises applying a pressure of lower than 1×10E-5 Torr to said process chamber.

4. The method of claim 1 wherein the step of removing oxygen from said process chamber comprises purging and re-filling the chamber with pure, dehydrated inert gas.

5. The method of claim 1 wherein the step of removing oxygen from said process chamber comprises purging and re-filling the chamber with purified hydrogen.

6. The method of claim 3 wherein the step of removing oxygen from said process chamber further comprises placing said joining pre-assembly in a zirconium inner chamber within said process chamber.

7. The method of claim 1 wherein said step of heating said joining pre-assembly to a first joining temperature comprises heating said joining pre-assembly for a duration of between 10 minutes and 2 hours.

8. The method of claim 1 wherein said step of heating said joining pre-assembly to a first joining temperature comprises heating said joining pre-assembly for a duration of between 30 minutes and 1 hour.

9. A method for the joining of ceramic materials, said method comprising the steps of:
placing an aluminum brazing element in a joint interface area between a first ceramic piece and a second ceramic piece to create a joining pre-assembly, wherein said aluminum brazing element comprises 99% by weight or greater aluminum, wherein said first ceramic comprises a ceramic from the group of beryllium oxide, and zirconia, and said second ceramic comprises a ceramic from the group of aluminum nitride, alumina, beryllium oxide, and zirconia;
placing the components of said joining pre-assembly in a process chamber; and
heating at least said aluminum brazing element of said joining pre-assembly to a first joining temperature of between 770 C and 1200 C, thereby joining said first ceramic piece to said second ceramic piece with an aluminum joint while maintaining a minimum joint thickness by using a plurality of standoffs of a first thickness, wherein the thickness of said joint is maintained during said heating to be greater than or equal to said first thickness, said first thickness being greater than zero, wherein said brazing element prior to brazing is of a second thickness greater than said first thickness, wherein said aluminum has not diffused into said first ceramic piece or said second ceramic piece.

10. The method of claim 9 further comprising the step of removing oxygen from said process chamber.

11. The method of claim 10 wherein the step of removing oxygen from said process chamber comprises applying a pressure of lower than 5×10E-5 Torr to said process chamber.

12. The method of claim 10 wherein the step of removing oxygen from said process chamber comprises applying a pressure of lower than 1×10E-4 Torr to said process chamber.

13. The method of claim 10 wherein the step of removing oxygen from said process chamber comprises purging and re-filling the chamber with pure, dehydrated inert gas.

14. The method of claim 10 wherein the step of removing oxygen from said process chamber comprises purging and re-filling the chamber with purified hydrogen.

15. The method of claim 10 wherein said step of heating said joining pre-assembly to a first joining temperature comprises heating said joining pre-assembly for a duration of between 10 minutes and 4 hours.

16. The method of claim 10 wherein said step of heating said joining pre-assembly to a first joining temperature comprises heating said joining pre-assembly for a duration of between 25 minutes and 1 hour.

17. A method for the joining of ceramic materials, said method comprising the steps of:
placing an aluminum brazing element in a joint interface area between a first ceramic piece and a second ceramic piece to create a joining pre-assembly, wherein zirconia, and said second ceramic comprises a ceramic from the group of beryllium oxide, and zirconia;
placing the components of said joining pre-assembly in a process chamber; and
heating at least said aluminum brazing element of said joining pre-assembly to a first joining temperature of between 770 C and 1200 C, thereby joining said first ceramic piece to said second ceramic piece with an aluminum joint while maintaining a minimum joint thickness by using a plurality of standoffs of a first thickness, wherein the thickness of said joint is maintained during said heating to be greater than or equal to said first thickness, said first thickness being greater than zero, wherein said brazing element prior to brazing is of a second thickness greater than said first thickness, wherein said aluminum has not diffused into said first ceramic piece or said second ceramic piece.

18. The method of claim 1 said first ceramic comprises a ceramic from the group of alumina, beryllium oxide, and zirconia, and wherein said aluminum has not diffused into said first ceramic piece or said second ceramic piece.

19. A method for the joining of ceramic materials, said method comprising the steps of:
placing an aluminum brazing element between an interface area of a first ceramic piece and an interface area of a second ceramic piece to create a joining pre-assembly, wherein said second ceramic comprises zirconia, wherein said aluminum has not diffused into said second ceramic piece, and wherein said aluminum brazing element comprises 99% by weight or greater aluminum;
placing the components of said joining pre-assembly into a process chamber;
removing oxygen from said process chamber;
heating at least said aluminum brazing element of said joining pre-assembly to a first joining temperature of between 770 C and 1200 C, thereby joining said first ceramic piece to said second ceramic piece with a hermetically sealed aluminum joint wherein said aluminum has not diffused into said second ceramic piece, and wherein the thickness of said final joint is greater than zero.

20. The method of claim 19 wherein the step of removing oxygen from said process chamber comprises applying a pressure of lower than 1×10E-4 Torr to said process chamber.

21. The method of claim 19 wherein the step of removing oxygen from said process chamber comprises applying a pressure of lower than 1×10E-5 Torr to said process chamber.

22. The method of claim 19 wherein the step of removing oxygen from said process chamber comprises purging and re-filling the chamber with pure, dehydrated inert gas.

23. The method of claim 19 wherein the step of removing oxygen from said process chamber comprises purging and re-filling the chamber with purified hydrogen.

24. The method of claim 21 wherein the step of removing oxygen from said process chamber further comprises placing said joining pre-assembly in a zirconium inner chamber within said process chamber.

25. The method of claim 19 wherein said step of heating said joining pre-assembly to a first joining temperature comprises heating said joining pre-assembly for a duration of between 10 minutes and 2 hours.

26. The method of claim 19 wherein said step of heating said joining pre-assembly to a first joining temperature comprises heating said joining pre-assembly for a duration of between 30 minutes and 1 hour.

\* \* \* \* \*